(12) United States Patent
Katagiri et al.

(10) Patent No.: US 6,828,174 B2
(45) Date of Patent: Dec. 7, 2004

(54) SEMICONDUCTOR DEVICE AND A METHOD OF MANUFACTURING THE SAME

(75) Inventors: Mitsuaki Katagiri, Nishitokyo (JP); Yuji Shirai, Hamura (JP); Yoshiyuki Kado, Hanakoganei (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/364,318

(22) Filed: Feb. 12, 2003

(65) Prior Publication Data

US 2003/0111737 A1 Jun. 19, 2003

Related U.S. Application Data

(62) Division of application No. 10/132,239, filed on Apr. 26, 2002.

(30) Foreign Application Priority Data

Jun. 7, 2001 (JP) ........................................ 2001-173134

(51) Int. Cl.[7] .......................... H01L 21/44; H01L 21/48; H01L 21/50
(52) U.S. Cl. ........................................ 438/107; 438/108
(58) Field of Search ................................ 438/107–109, 438/612, 617, 126

(56) References Cited

U.S. PATENT DOCUMENTS 6,100,594 A * 8/2000 Fukui et al. ................. 257/777
6,157,080 A * 12/2000 Tamaki et al. ............... 257/738
6,172,422 B1 1/2001 Chigawa et al.
6,200,888 B1 * 3/2001 Ito et al. ...................... 438/597
6,218,630 B1 4/2001 Takigami
6,351,028 B1 2/2002 Akram
6,407,456 B1 6/2002 Ball
6,507,115 B1 1/2003 Hofstee et al.
2002/0145203 A1 10/2002 Adae-Amoakoh et al.

FOREIGN PATENT DOCUMENTS

| JP | 4-302164 | 10/1992 |
|----|----------|---------|
| JP | 5-47998 | 2/1993 |
| JP | 11-204720 | 7/1999 |
| WO | WO99/23696 | 5/1999 |

OTHER PUBLICATIONS

Technical Research Council, May 28, 2000, "Electronics Mounting Technique: 2000 Extra Edition", pp. 81–113.

* cited by examiner

*Primary Examiner*—David Zarneke
(74) *Attorney, Agent, or Firm*—Mattingly, Stanger & Malur, P.C.

(57) ABSTRACT

With respect to two types of chips to be mounted on a main surface of a package substrate, the ratio of chip area to the number of terminals of one chip and that of the other chip are compared with each other and the chip smaller in the ratio is mounted by the wire bonding method, while the chip larger in the ratio is mounted by the flip-chip method. It is possible to reduce the cost of manufacturing a multi-chip module wherein plural types of chips having different terminal pitches are mounted on a wiring substrate.

6 Claims, 41 Drawing Sheets

FIG. 13
FIG. 14
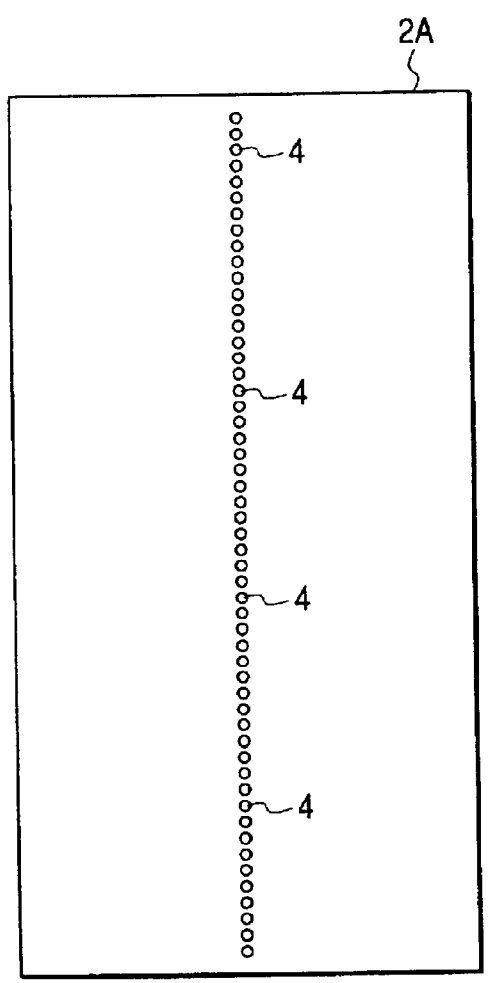
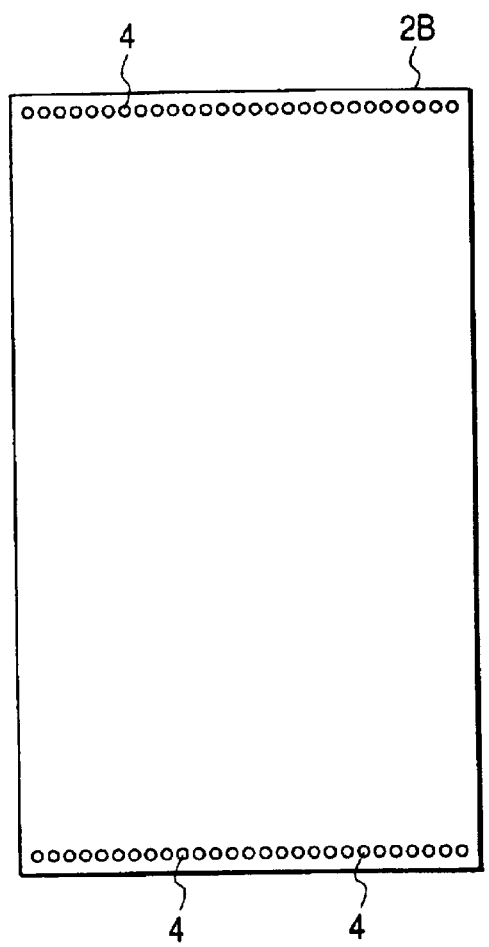

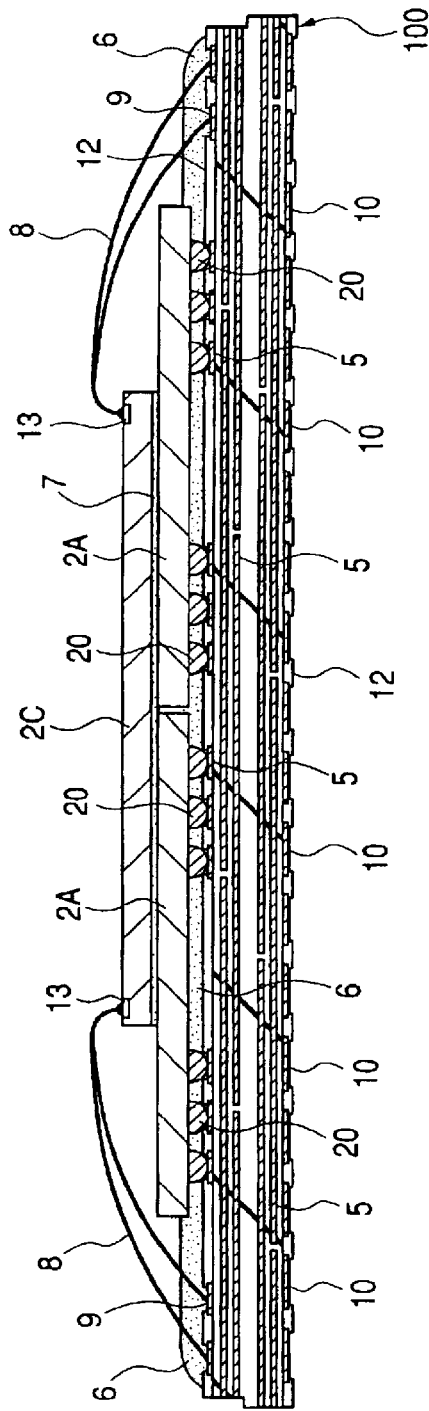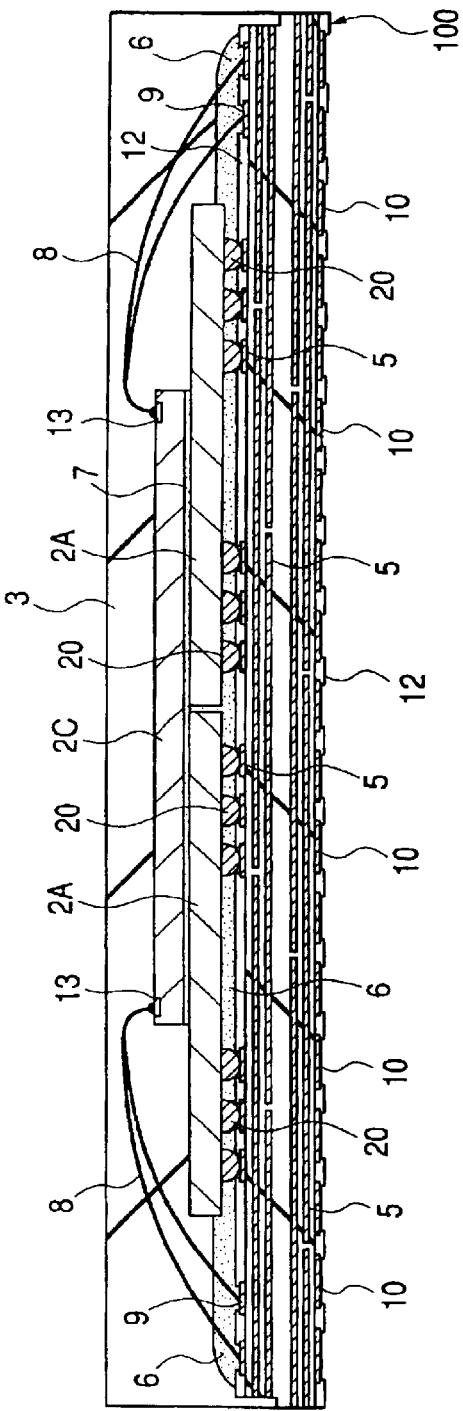

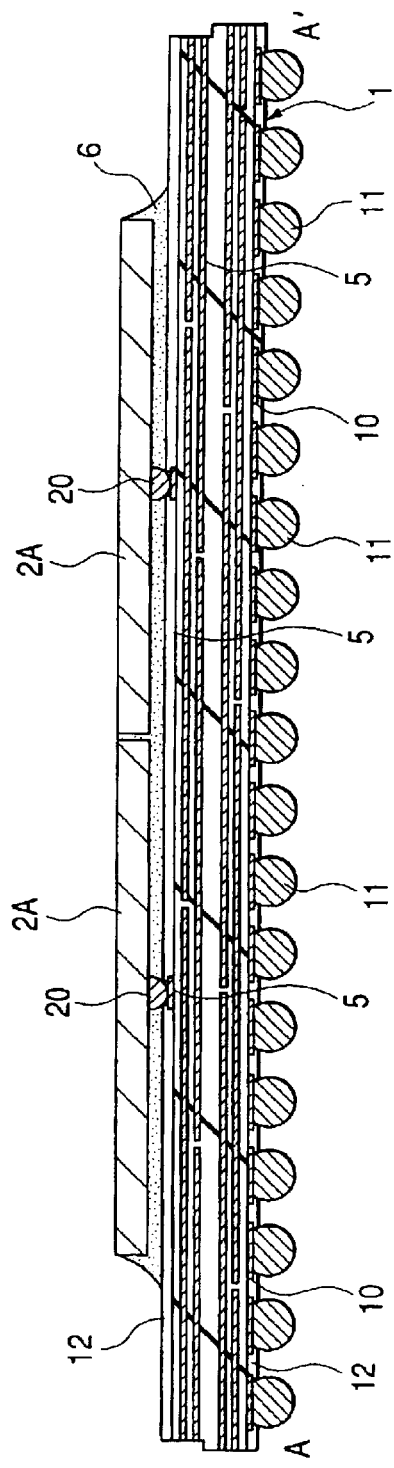
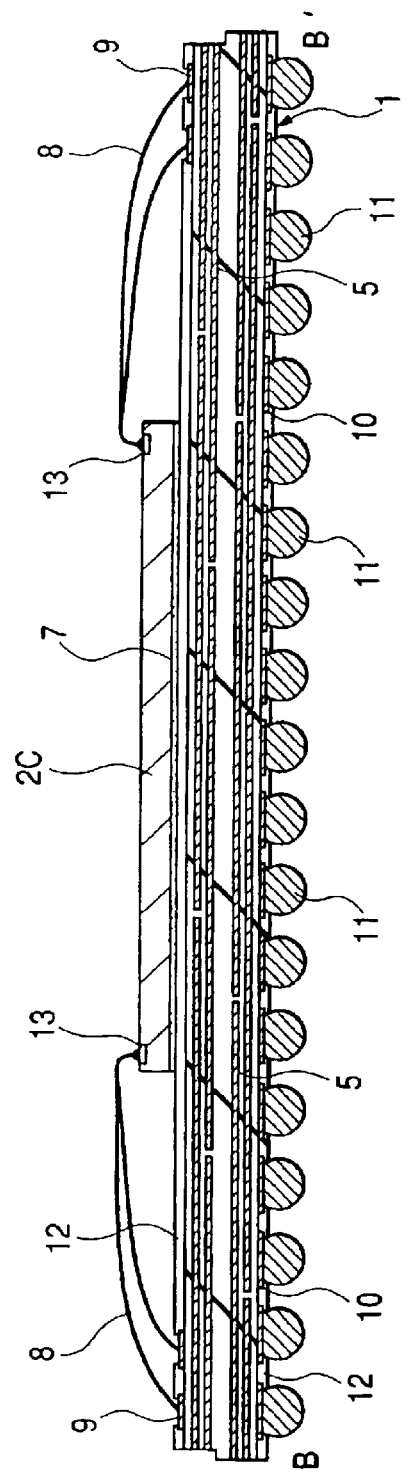

SEMICONDUCTOR DEVICE AND A METHOD OF MANUFACTURING THE SAME

This is a divisional application of U.S. Ser. No. 10/132,239, filed Apr. 26, 2002.

BACKGROUND OF THE INVENTION

The present invention relates to a semiconductor device and a technique for manufacturing the same. Particularly, the present invention is concerned with a technique which is effectively applicable to a multi-chip module (MCM) with plural types of semiconductor chips of different terminal pitches mounted on a wiring substrate.

As a measure for increasing the capacity of memory LSIs such as flash memory and DRAM (Dynamic Random Access Memory), various memory module structures have been proposed in which-semiconductor chips (memory chips) with such memory LSIs formed thereon are stacked and sealed in a single package.

For example, Japanese Published Unexamined Patent Application No. Hei 4(1992)-302164 discloses a package structure wherein plural semiconductor chips of the same function and same size are stacked stepwise through an insulating layer within a single package and bonding pads exposed to stepped portions of the semiconductor chips and inner leads of the package are electrically connected together through wires.

In Japanese Published Unexamined Patent Application No. Hei 11(1999)-204720 there is disclosed a package structure wherein a first semiconductor chip is mounted on an insulating substrate through a thermocompression bonding sheet, a second semiconductor chip having an external size smaller than that of the first semiconductor chip is mounted on the first semiconductor chip through an insulating sheet, bonding pads of the first and second semiconductor chips and a wiring layer on the insulating substrate are electrically connected together through wires, and the first and second semiconductor chips and the wires are sealed with resin.

Also known is a technique called Wafer Level CSP (Chip Size Package) or Wafer Process Package (WPP) wherein solder bumps are arranged in an array form on a main surface of a semiconductor chip and bonding pads and the solder bumps are electrically connected together through wires formed of Cu (copper) for example, thereby making the pitch of connecting terminals (solder bumps) wider than that of the bonding pads. With this technique, the terminal pitch of the semiconductor chip can be substantially widened, so that even without using an expensive build-up substrate with narrowed line and space of wires, it is possible to fabricate a memory module with use of a less expensive resin substrate having a wide wiring pitch. As to Wafer Level CSP, related descriptions are found, for example, in "Electronics Mounting Technique: 2000 Extra Edition," pp. 81 to 113, published by Kabushiki Kaisha TECHNICAL RESEARCH COUNCIL (May 28, 2000), and also in International Patent Publication WO99/23696.

SUMMARY OF THE INVENTION

The inventors in the present case are developing a multi-chip module with plural semiconductor chips (hereinafter referred to simply as "chip") mounted within a single package.

According to the multi-chip module now under our development, chips with memory LSIs such as DRAM (Dynamic Random Access Memory) and flash memory formed thereon and a chip with a high-speed microprocessor (MPU: microprocessing unit) formed thereon are sealed within a single resin package, whereby it is intended to implement a system more versatile than the conventional memory module wherein plural memory chips are sealed with resin.

The present inventors are now making a study about mounting chips on a less expensive resin substrate having a wide wiring pitch for the purpose of reducing the cost of manufacturing the multi-chip module. To this end it is necessary to substantially widen the terminal pitch of each chip by utilizing the foregoing Wafer Level CSP technique.

On this regard, there arises no problem in the case of a chip having a relatively small number of terminals like a chip with memory LSI such as DRAM or flash memory formed thereon, but in the case of a chip having a large number of terminals like a chip with a microprocessor formed thereon, a limit is encountered in substantially widening the terminal pitch of the chip even by utilizing the Wafer Level SCP technique.

For example, the minimum pitch of wires capable of being formed on an inexpensive resin substrate by utilizing the wiring substrate manufacturing technique available at present is 0.5 mm. On the other hand, in the case where 0.5 mm pitch solder bumps are to be formed by utilizing the wafer process package technique on a DRAM having a chip size of 4.66 mm×8.22 mm and having 64 pins as terminals and a terminal pitch of 0.08 mm, there arises no problem because a maximum of 128 pins of solder bumps can be formed. However, when 0.5 mm pitch solder bumps are to be formed on, for example, a microprocessor having a chip size of 6.84 mm×6.84 mm and having 256 pins as terminals and a terminal pitch of 0.08 mm, there can be formed only 169 pins of solder bumps even as a maximum number. Therefore, if this chip is to be mounted in accordance with a flip-chip method, it is necessary to use an expensive build-up substrate having a wiring pitch of 0.4 mm or less.

It is an object of the present invention to provide a technique which can reduce the cost of manufacturing a multi-chip module with plural types of chips different in terminal pitch mounted on a wiring substrate.

The above and other objects and novel features of the present invention will become apparent from the following description and the accompanying drawings.

A typical invention out of those disclosed herein will be outlined below.

A multi-chip module according to the present invention comprises a wiring substrate with plural wires and plural bonding pads formed on a main surface thereof, one or plural first semiconductor chips mounted in a first area of the main surface of the wiring substrate and connected electrically to the wires through plural bump electrodes, and a second semiconductor chip stacked on the first semiconductor chip(s) and connected electrically to the bonding pads through plural wires, wherein a terminal pitch of the second semiconductor chip is narrower than that of the first semiconductor chip(s).

BRIEF DESCRIPTION OF THE DRAWINGS

FIG. 13 is a plan view of a semiconductor chip used in manufacturing the semiconductor device;

FIG. 14 is a plan view of the semiconductor chip;

FIG. 35 is an enlarged sectional view of a principal portion of the multi-wiring substrate, showing the semiconductor device manufacturing method;

FIG. 36 is an enlarged sectional view of a principal portion of the multi-wiring substrate, showing the semiconductor device manufacturing method;

FIG. 42 is a sectional view taken along line A–A' of FIG. 41;

FIG. 43 is a sectional view taken along line B–B' of FIG. 41;

DETAILED DESCRIPTION OF THE PREFERRED EMBODIMENTS

Figure 1:
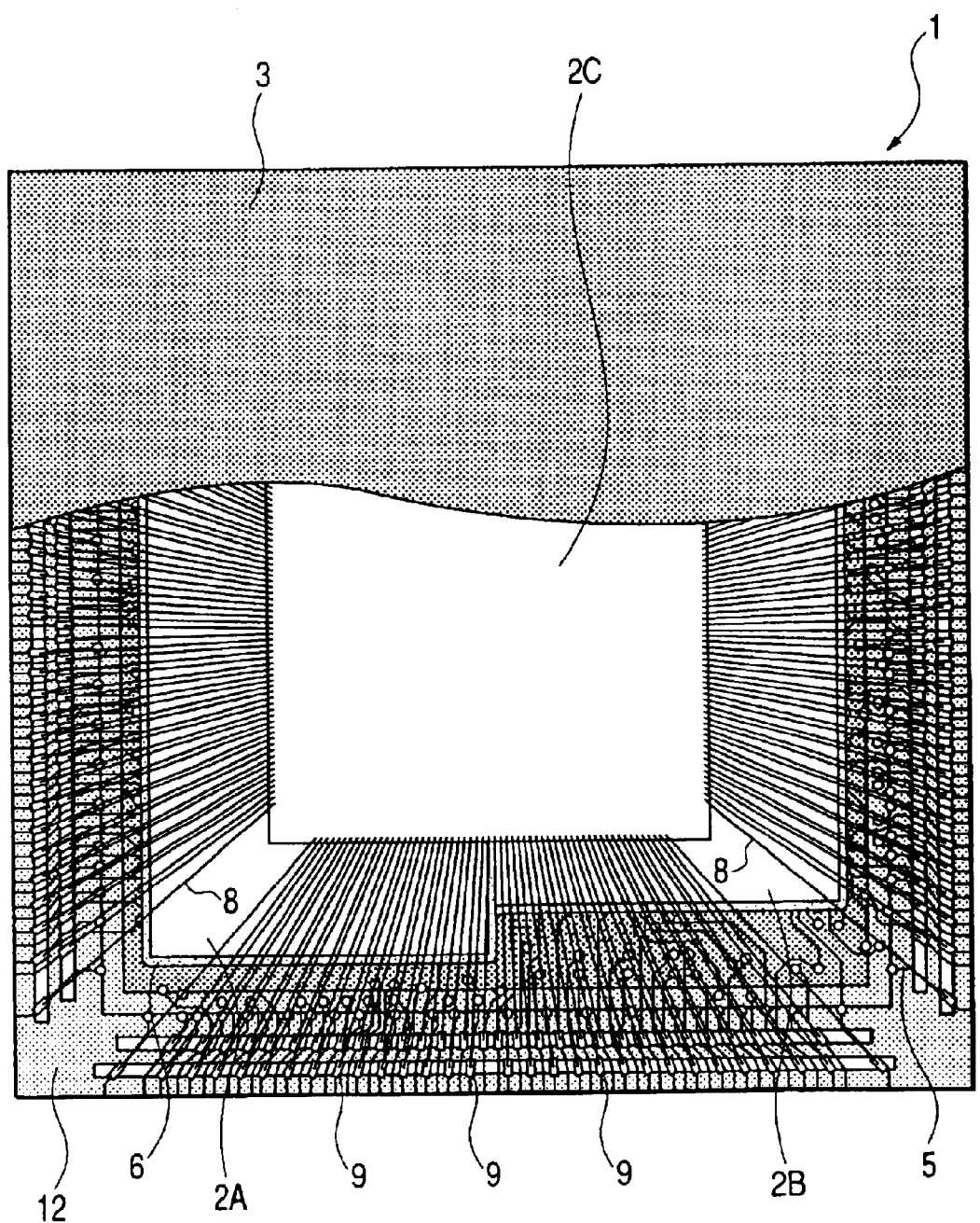
FIG. 1 is a plan view of a semiconductor device according to an embodiment of the present invention.

Embodiments of the present invention will be described hereinunder with reference to the drawings. In all of the drawings for illustrative of the embodiments the same members are identified by the same reference numerals and repeated explanations thereof will be omitted.

First Embodiment

Figure 2:
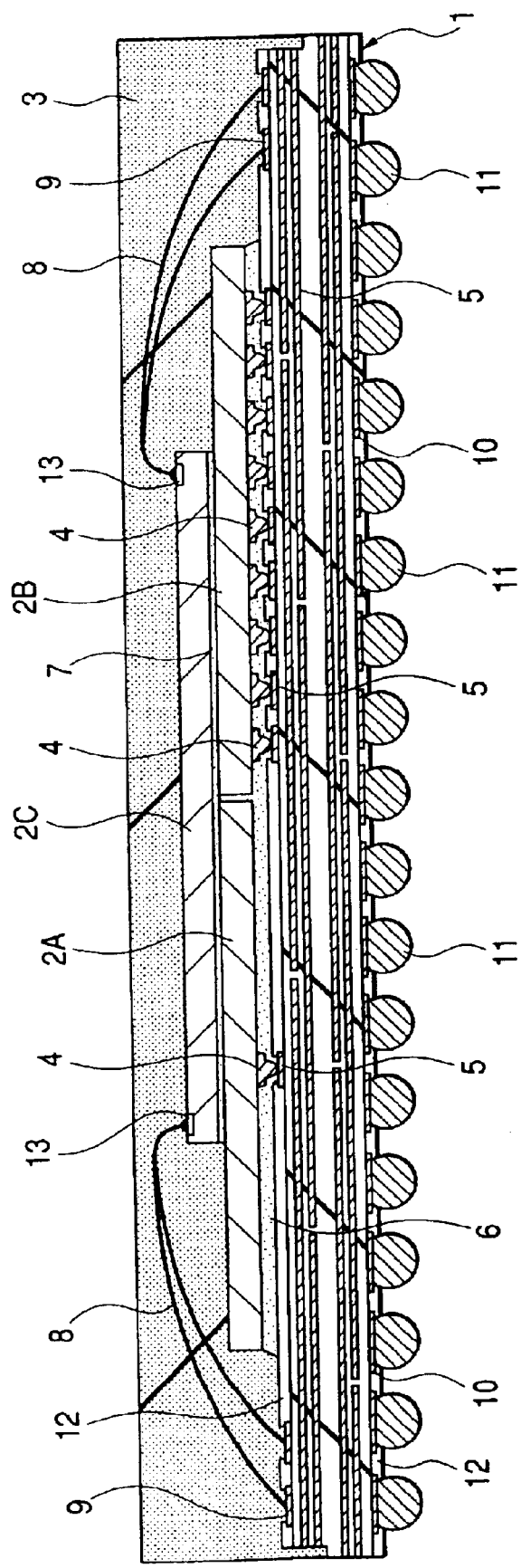
FIG. 2 is a sectional view of the semiconductor device.
Figure 3:
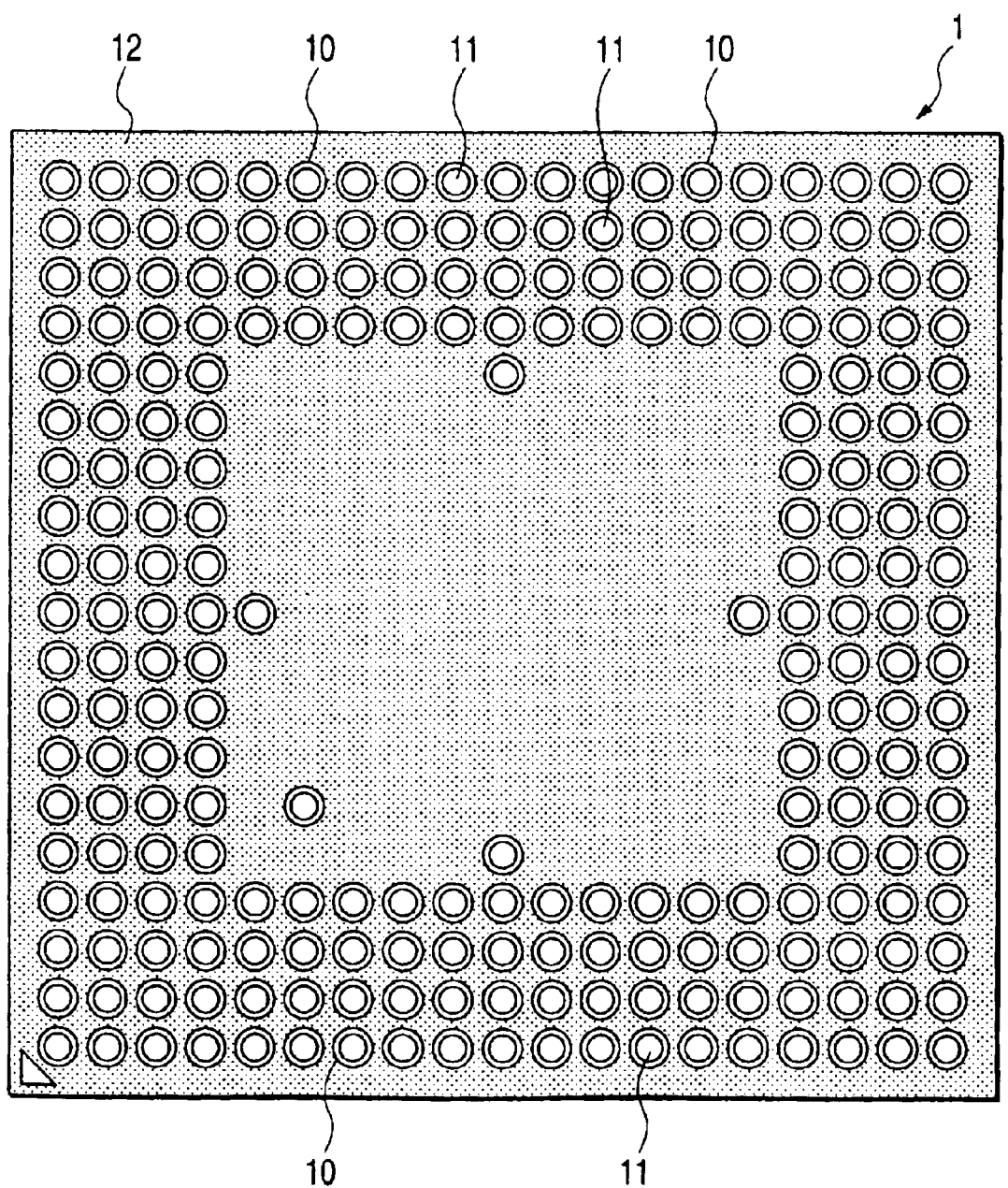
FIG. 3 is a plan view of the semiconductor device.

FIG. 1 is a plan view showing an upper surface of a semiconductor device according to an embodiment of the present invention, FIG. 2 is a sectional view of the semiconductor device, and FIG. 3 is a plan view showing a lower surface of the semiconductor device.

The semiconductor device of this embodiment is a multi-chip module (MCM), in which three chips 2A, 2B, and 2C are mounted on a main surface of a package substrate 1 and are sealed with a molding resin 3. Of the three chips 2A to 2C, the two chips 2A and 2B are arranged side by side on the main surface of the package substrate 1 and are electrically connected to wires 5 on the package substrate 1 through plural Au bumps 4 formed on main surfaces of the chips. Thus, the chips 2A and 2B are mounted by the flip-chip method.

A gap is formed between the mains surfaces (lower surfaces) of the chips 2A, 2B and the main surface of the package substrate 1 and the gap is filled with underfill resin (sealing resin) 6. The chip 2A is a silicon chip with, for example, DRAM formed thereon and the chip 2B is a silicon chip with, for example, flash memory formed thereon.

The chip 2C is disposes so as to span the two chips 2A and 2B and is bonded to upper surfaces of the chips 2A and 2B with an adhesive 7. Bonding pads 13 formed on a main surface of the chip 2C are electrically connected to bonding pads 9 formed on the package substrate 1 through plural Au wires 8. Thus, the chip 2C is mounted by the wire bonding method. The chip 2C is a silicon chip with, for example, a high-speed microprocessor (MPU: microprocessing unit) formed thereon. The terminal pitch of the chip 2C is narrower than that of the two chips 2A and 2B.

The package substrate 1 with the three chips 2A, 2B, and 2C mounted thereon is a multi-layer wiring substrate formed mainly by a general-purpose resin such as epoxy resin (glass-epoxy resin) containing glass fibers. About 4 to 6 layers of wires 5 are formed on the main surface (upper surface), lower surface and the interior of the package substrate.

Plural electrode pads 10, which are electrically connected to the wires 5, are arranged in array form on the lower surface of the package substrate 1 and solder bumps 11 which constitute external connecting terminals of the multi-chip module (MCM) are connected to the electrode pads 10 respectively. The multi-chip module (MCM) is mounted through the solder bumps 11 onto a wiring substrate of an electronic device for example. Both main surface and lower surface of the package substrate 1 are coated with solder resist 12 such as an epoxy resin or acrylic resin except the surfaces of the connections between wires 5 and chips 2A, 2B, bonding pads 9 and electrode pads 10.

As an example of size of the multi-chip module (MCM), the package substrate 1 has external dimensions of 13 mm in length, 13 mm in width, and 0.3 mm in thickness. The chips 2A, 2B, and 2C mounted on the package substrate 1 are each 0.15 mm thick and the spacing between the two juxtaposed chips 2A and 2B is 20 to 100 $\mu$m. The thickness of the molding resin 3 which seals the chips 2A, 2B, and 2C is 0.66 mm and the distance from an upper surface of the molding resin 3 to a lower end of each solder bump 11, i.e., a mounting height of the multi-chip module (MCM), is 1.468 mm.

The pitch of the Au bumps 4 formed on the main surface of the chip 2A is 0.8 mm and the pitch of the Au bumps 4 formed on the main surface of the chip 2B is 0.15 mm. On the other hand, the pitch of the bonding pads 13 formed on the main surface of the chip 2C is 0.065 mm. That is, the terminal pitch of the chip 2C with microprocessor formed thereon is narrower than the terminal pitch of the chip 2A with DRAM formed thereon and that of the pitch 2B with flash memory formed thereon.

Thus, in the multi-chip module (MCM) of this embodiment, the chips 2A and 2B having a relatively wide terminal pitch are mounted on the package substrate 1 by the flip-chip method, while the chip 2C of the narrowest terminal pitch is stacked on the chips 2A and 2B and is mounted by the wire bonding method.

In this way the chips 2A, 2B, and 2C can be mounted on an inexpensive general-purpose resin substrate having a wide pitch of wires 5, thus permitting reduction in the manufacturing cost of the multi-chip module (MCM).

Besides, the packaging area of the package substrate 1 can be made small by stacking the chip 2C on the chips 2A and 2B, whereby it is possible to implement a multi-chip module (MCM) having a high packaging density.

Next, a method of manufacturing the semiconductor device constructed as above will be described below step by step with reference to FIGS. 4 to 26.

Figure 4:
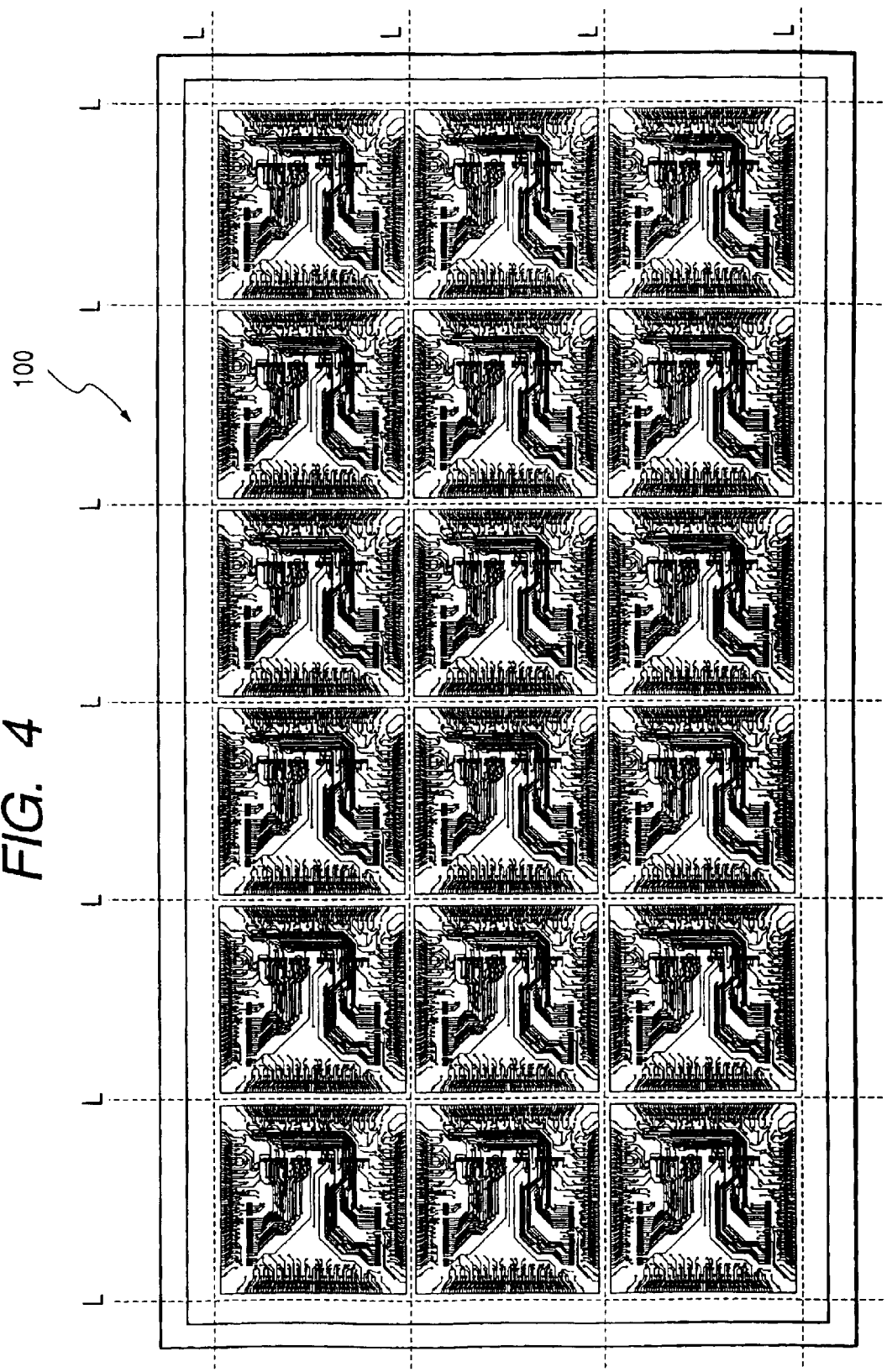
FIG. 4 is a plan view of a multi-wiring substrate used for manufacturing the semiconductor device.
Figure 5:
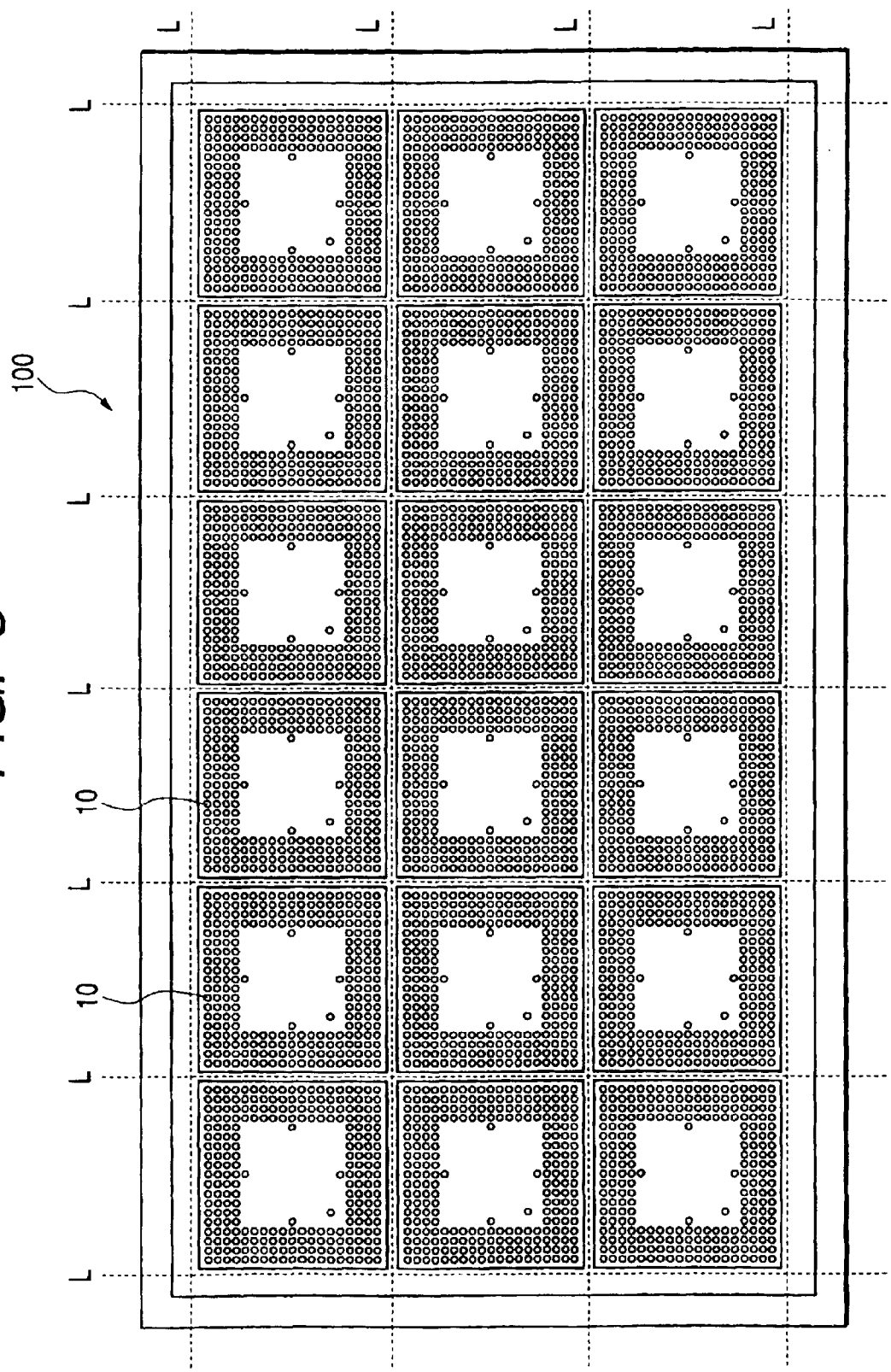
FIG. 5 is a plan view of the multi-wiring substrate.
Figure 6:
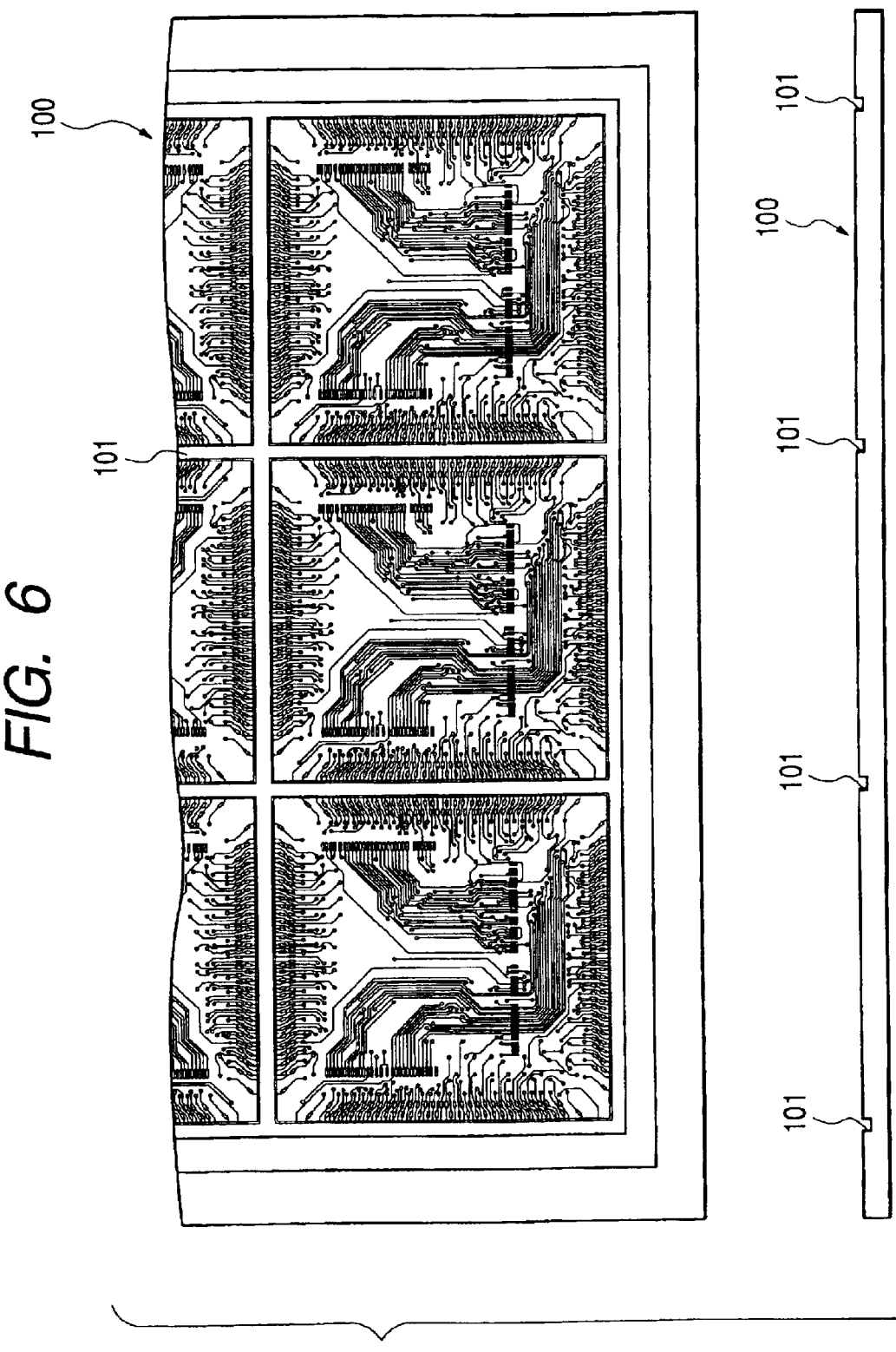
FIG. 6 is an enlarged plan view of a principal portion of the multi-wiring substrate shown in FIG. 5.
Figure 7:
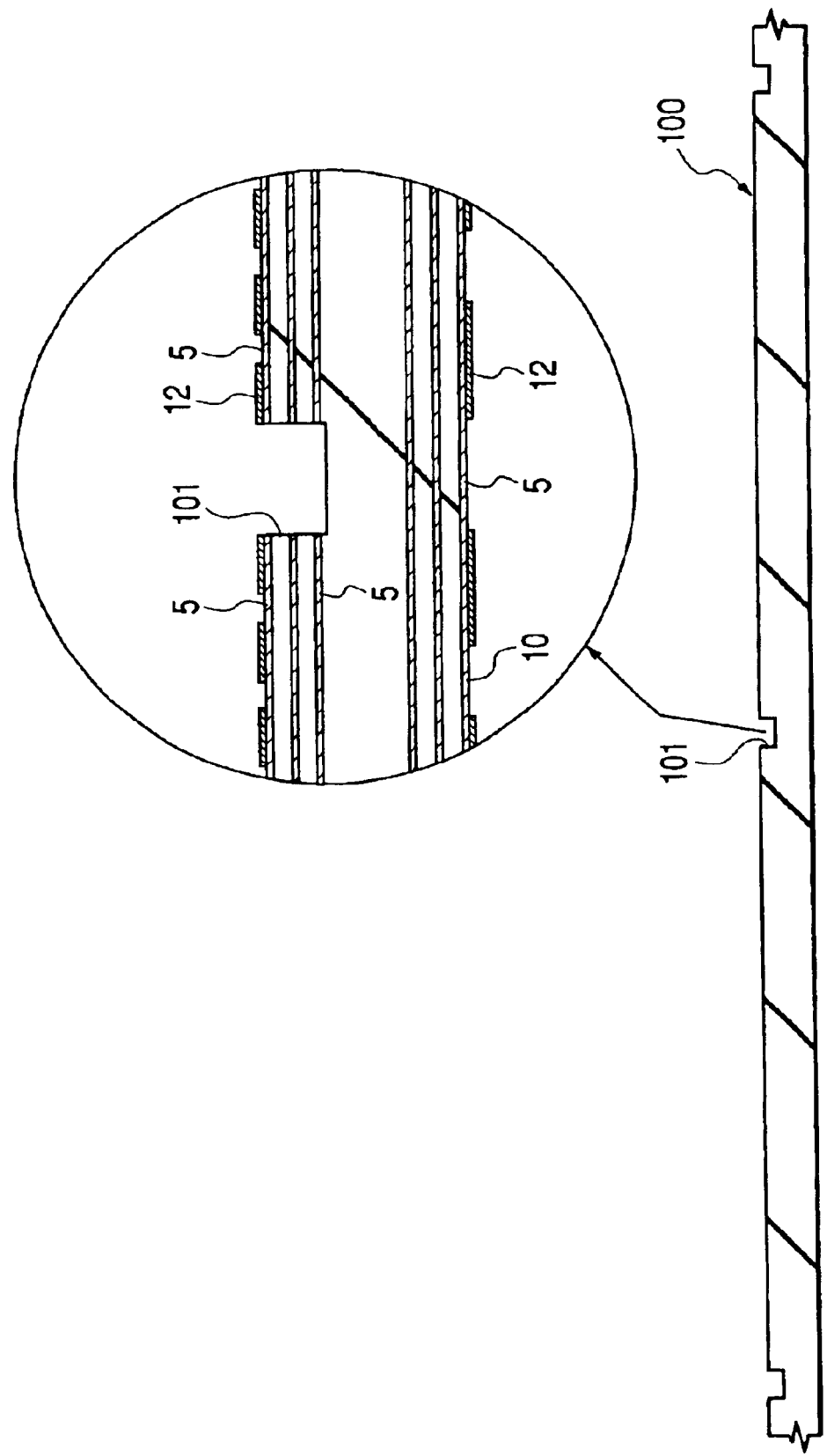
FIG. 7 is an enlarged sectional view of a principal portion of the multi-wiring substrate shown in FIG. 5.
Figure 8:
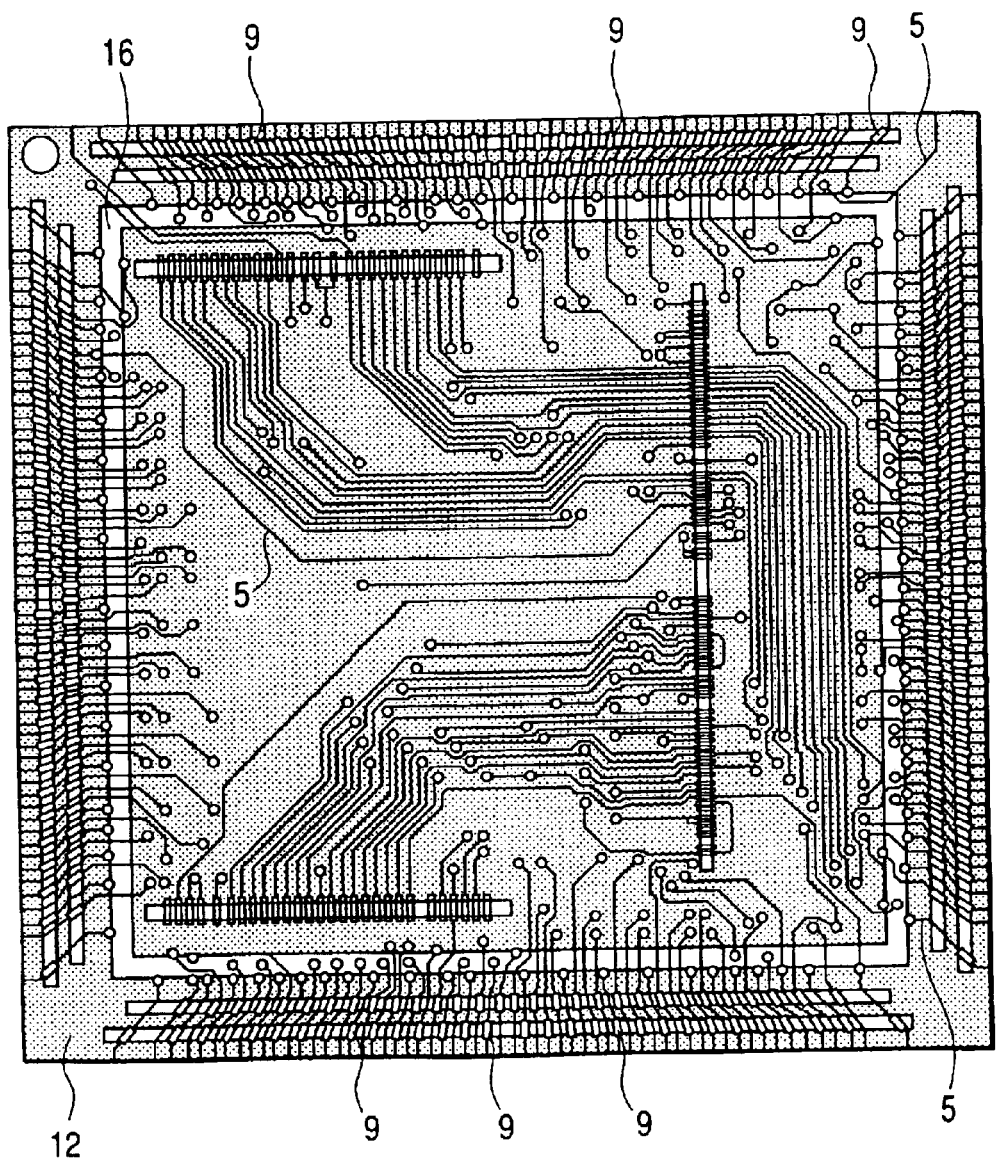
FIG. 8 is an enlarged plan view of a principal portion of the multi-wiring substrate shown in FIG. 5.
Figure 9:
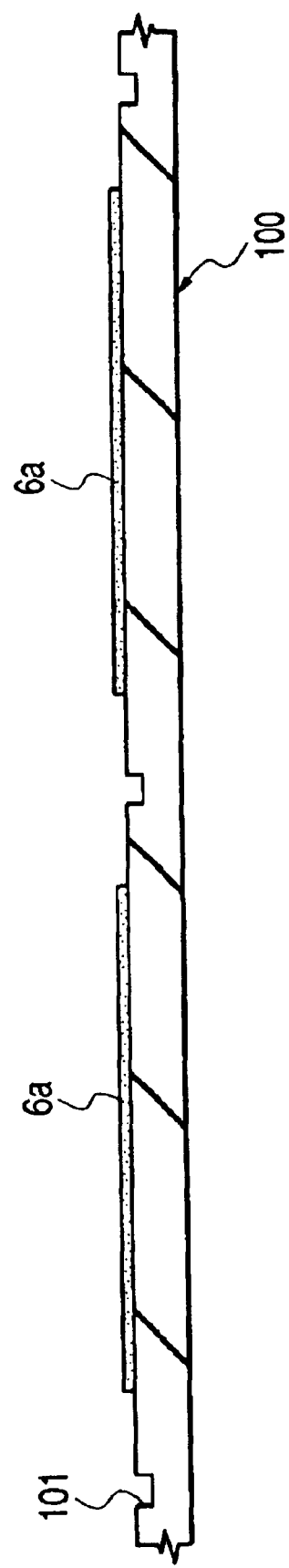
FIG. 9 is an enlarged sectional view of a principal portion of the multi-wiring substrate, showing a method for manufacturing the semiconductor device.
Figure 10:
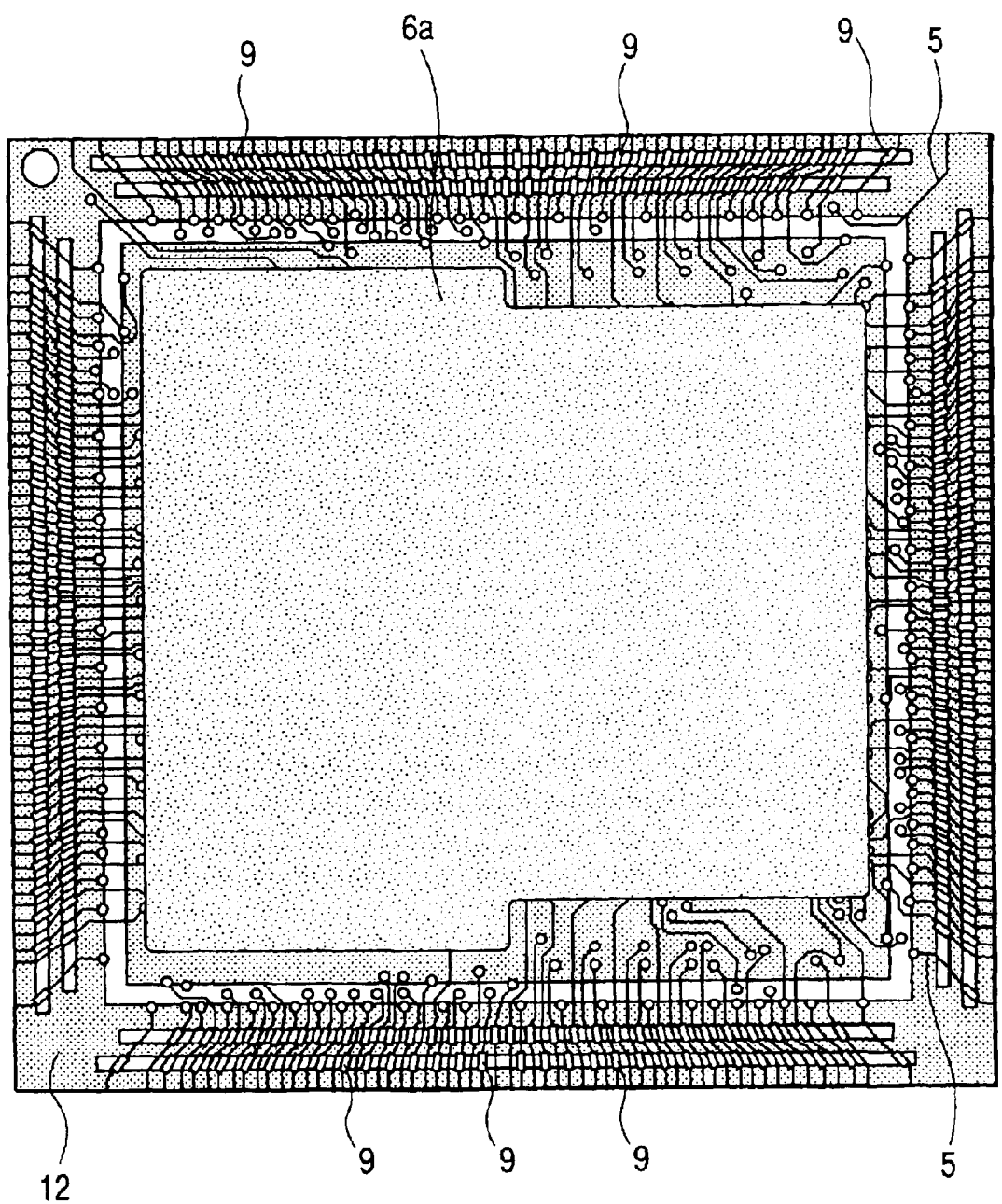
FIG. 10 is an enlarged plan view of a (principal portion of the multi-wiring substrate, showing the semiconductor device manufacturing method.

FIGS. 4 to 8 illustrate a rectangular substrate (hereinafter referred to as "multi-chip substrate 100") which is used in the manufacture of a multi-chip module (MCM). FIG. 4 is an entire plan view showing a main surface (chip mounting surface) of the multi-wiring substrate 100, FIG. 5 is an entire plan view showing a back side of the multi-wiring substrate, FIG. 6 comprises a plan view and a side view, showing a part of the multi-wiring substrate 100, FIG. 7 is a sectional view showing a part of the multi-wiring substrate 100, and FIG. 8 is an enlarged plan view showing a part (an area corresponding to one package substrate) of the multi-wiring substrate 100.

The multi-wiring substrate 100 is a substrate serving as a matrix of the package substrate 1. The multi-wiring substrate 100 is diced in lattice form into individual substrates along dicing lines L shown in FIGS. 4 and 5, whereby plural package substrates 1 are obtained. The illustrated multi-wiring substrate 100 is partitioned in its longitudinal direction into six blocks of package substrate forming areas and in its width direction into three blocks of package substrate forming areas, thus affording 3×6=16 package substrates 1.

The multi-wiring substrate 100 is a multi-layer wiring substrate formed mainly by a general-purpose resin such as glass-epoxy resin. Wires 5 and bonding pads 9 are formed on a main surface of the multi-wiring substrate 100, while electrode pads 10 are formed on a back side of the multi-wiring substrate. Further, plural layers of wires 5 are formed in the interior of the multi-wiring substrate 100. By fabricating the package substrate 1 with use of an inexpensive general-purpose resin it is possible to reduce the manufacturing cost of the multi-chip module (MCM).

The wires 5 and bonding pads 9 on the main surface of the multi-wiring substrate 100 and the electrode pads on the back side of the same substrate are formed by etching Cu foil affixed to both surface and back of the substrate. As to the wires 5 on the main surface of the multi-wiring substrate 100, the surface of the area not covered with solder resist 12, i.e, the surface of the area to which the Au bumps 4 of the chips 2A and 2B are connected, is plated with Ni and Au. Surfaces of the bonding pads 9 and electrode pads 10 are also Ni- and Au-plated. These plated surfaces may be formed by electroless plating, but a plated layer formed by electroless plating is thin and it is difficult to ensure a high bonding strength when Au wires 4 are connected onto the bonding pads 9. For this reason, the above Ni—Au plating is performed by an electrolytic plating method.

In the case where the surfaces of the wires 5, bonding pads 9 and electrode pads 10 are subjected to Ni and Au plating by electrolytic plating, the plating is performed in a conducting state of the wires 5, bonding pads 9 and electrode pads 10 throughout the whole area of the multi-wiring substrate 100, then the wires 5 on the dicing lines L are cut with a router, and thereafter each package substrate forming area is tested for continuity. Therefore, as shown in FIGS. 6 and 7, grooves 101 remain in the dicing lines L on the main surface of the multi-wiring substrate 100 as traces left after cutting the wires 5 in the package substrate forming areas with the router.

As shown in FIG. 8, plural bonding pads 13 are formed in two rows along the fours sides of each package substrate forming area so as to surround the chip mounting area. A dam area 16 is formed between the bonding pads 13 and the chip mounting area so as to surround the chip mounting area. The dam area 16 is an area in which the solder resist 12 is not formed, and the height of its surface is lower than that of the inside and outside areas where the solder resist 12 is formed. Consequently, when the underfill resin 6 is charged to below the chips 2A and 2B, the resin 6 is prevented from flowing to the surrounding portion of the package substrate forming area, i.e., the area where the bonding pads 13 are formed.

For fabricating the multi-chip module (MCM) using the multi-wiring substrate 10, a resin tape 6a is affixed to each chip mounting area on the main surface of the multi-wiring substrate 100. For example, the resin tape 6a formed by a thermosetting epoxy resin with silica of about 3 µm in particle diameter dispersed therein. The resin tape 6a is cut beforehand to about the same size as the two chips (2A, 2B). The resin tape 6a may also be constituted by an anisotropic conductive resin (ACF) with conductive fine particles dispersed in resin.

When the multi-wiring substrate 100 is left standing in air, moisture contained in the air gets into the substrate, so if the resin tape 6a is affixed thereto directly, there is a fear that the two may become less adhesive. Therefore, when affixing the resin tape 6a to the main surface of the multi-wiring substrate 100, it is desirable to bake the multi-wiring substrate 100 just before the affixing of the tape to remove the moisture. Conditions for the baking are, for example, 125° C., 2 hours. If the multi-wiring substrate 100 is treated with plasma after the baking to activate the surface of the substrate, it is possible to further improve the adhesion between the resin tape 6a and the multi-wiring substrate 100.

Figure 11:
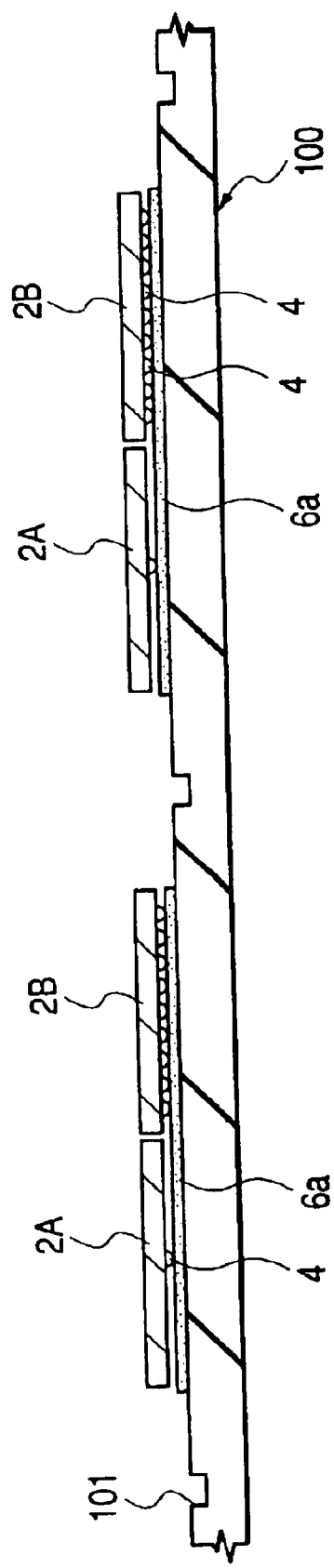
FIG. 11 is an enlarged sectional view of a principal portion of the multi-wiring substrate, showing the semiconductor device manufacturing method.
Figure 12:
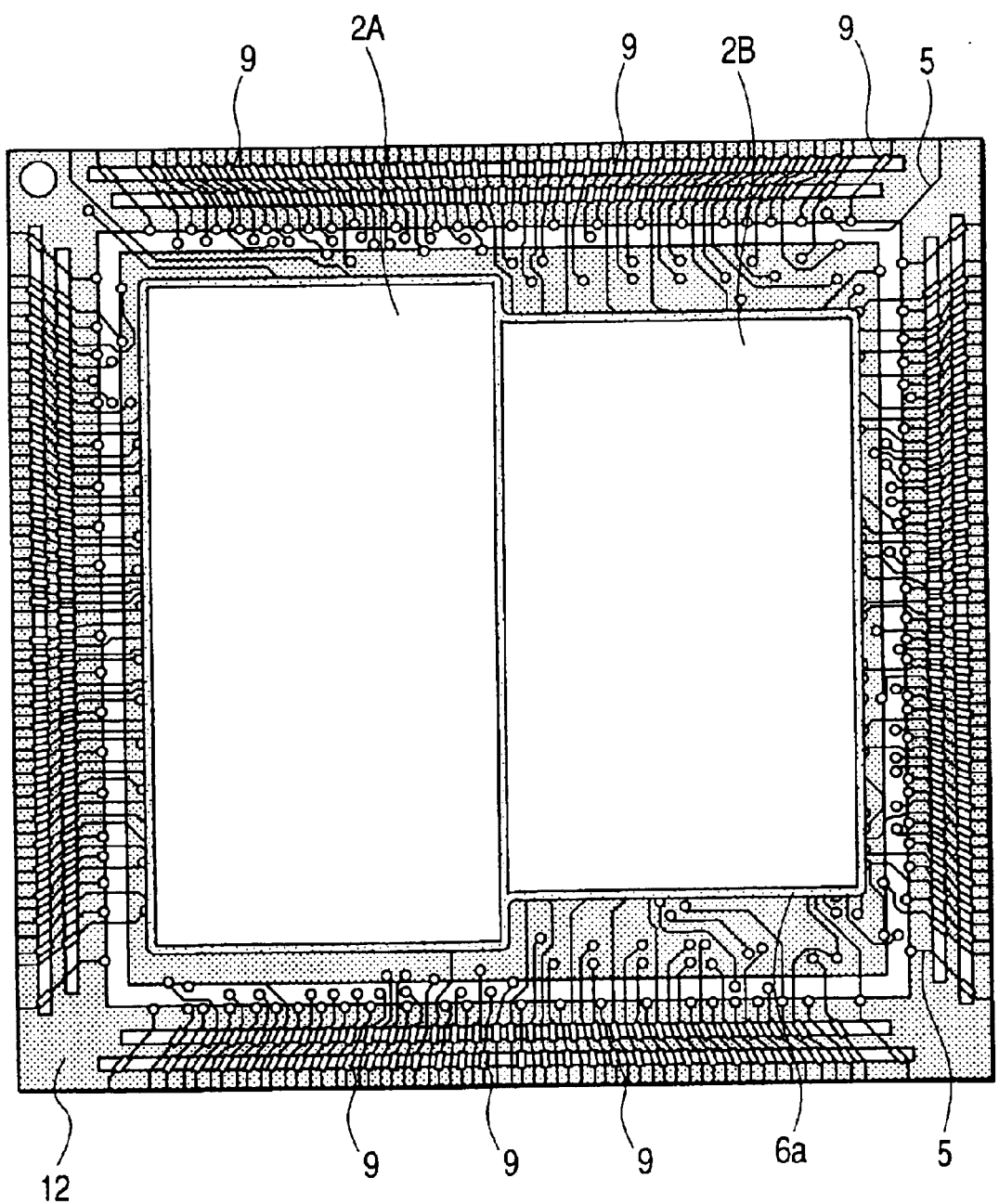
FIG. 12 is an enlarged plan view of a principal portion of the multi-wiring substrate, showing the semiconductor device manufacturing method.

Next, as shown in FIGS. 11 and 12, the two chips 2A and 2B are placed by a face-down method onto the resin tape 6a which has been affixed to the main surface of the multi-wiring substrate 100. At this time, a gap is set at about 20 to 100 µm between the chips 2A and 2B.

As shown in FIG. 13, Au bumps 4 are formed beforehand by a ball bonding method on the main surface of the chip 2A with DRAM formed thereon. As shown in FIG. 14, Au bumps 4 are also formed by the same method on the main surface of the chip 2B with flash memory formed thereon. These Au bumps 4 are formed in the final step of wafer process. More specifically, after completion of the ordinary wafer process, Au bumps 4 are formed on bonding pads of wafer by the ball bonding method, followed by dicing of the wafer to afford each individual chips 2A and 2B.

Usually, the bonding pads of DRAM are arranged in a row centrally of the chip, but the bonding pads of flash memory are arranged in two rows along short sides of the chip. Therefore, the pitch of the DRAM bonding pads is narrower than that of the flash memory bonding pads, with consequent decrease in pad diameter (for example, if the flash memory terminal pitch is 150 µm, the terminal pitch of DRAM is about 85 µm). Usually, therefore, Au wires of a small diameter (for example, 20 µm) are used to form Au bumps 4 on the DRAM bonding pads, while Au wires of a large diameter (for example, 30 µm) are used to form Au bumps 4 on the flash memory bonding pads.

In the multi-chip module (MCM) of this embodiment, however, since the third chip 2C is stacked on two chips 2A and 2B, it is necessary that the mounting heights of both chips 2A and 2B be made uniform by equalizing the chip thickness and the diameter of Au bumps 4 with respect to the two chips 2A and 2B. In this embodiment, therefore, Au wires used for forming Au bumps 4 on the bonding pads of flash memory are the same in diameter (for example, 20 µm) as Au wires used for forming Au bumps 4 on the bonding pads of DRAM. In this case, when the thickness (for example, 25 µm) of the solder resist 12 is taken into account, Au bumps 4 formed using fine Au wires becomes smaller in the area of contact with bonding pads. In view of this point and in order to ensure a required area of contact between Au bumps 4 and bonding pads, this embodiment adopts a multi-stage bump structure in which Au bumps 4 are bonded onto Au bumps 4 in a superimposed manner.

Figure 15:
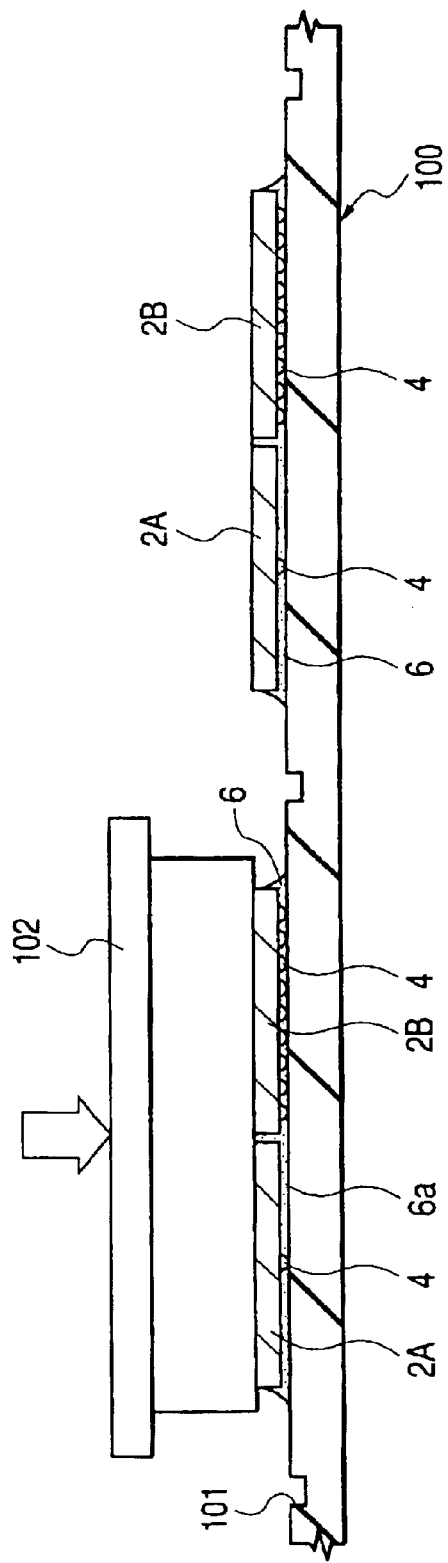
FIG. 15 is an enlarged sectional view of a principal portion of the multi-wiring substrate, showing the semiconductor device manufacturing method.

Next, as shown in FIG. 15, a heat tool 102 having a flat bottom is pushed onto the two chips 2A and 2B. For example, the pressure and temperature of the heat tool 102 are 15 kg/10 mm$^2$ and 235° C., respectively. As a result, the resin tape 6a melts and the underfill resin 6 is filled into the gap between the chips 2A, 2B and the multi-wiring substrate 100 and also into the gap between the chips 2A and 2B. Further, the Au bumps 4 on the chips 2A, 2B and the wires (not shown in FIG. 15) on the multi-wiring substrate 100 are electrically connected with each other.

Thus, in this embodiment, the resin tape 61 which has been processed to about the same size as the chips 2A and 2B is melted, thereby allowing the underfill resin 6 to be filled into the gap between the chips 2A, 2B and the multi-wiring substrate 100 and also into the gap between the chips 2A and 2B. According to this method, for example as compared with a resin fill method in which a liquid underfill resin is fed to the surroundings of the chips 2A and 2B, it is possible to decrease the amount of the underfill resin 6 protruding to the surroundings of the chips 2A and 2B and thus there is no fear that the bonding pads 9 arranged on the multi-wiring substrate 100 in a surrounding relation to the chips 2A and 2B may be covered with the underfill resin 6.

Figure 16:
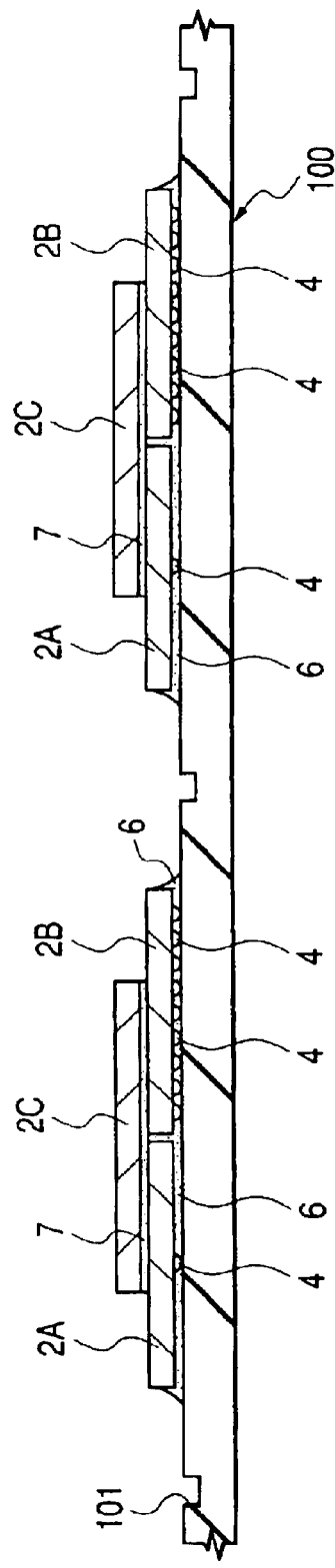
FIG. 16 is an enlarged sectional view of a principal portion of the multi-wiring substrate, showing the semiconductor device manufacturing method.
Figure 17:
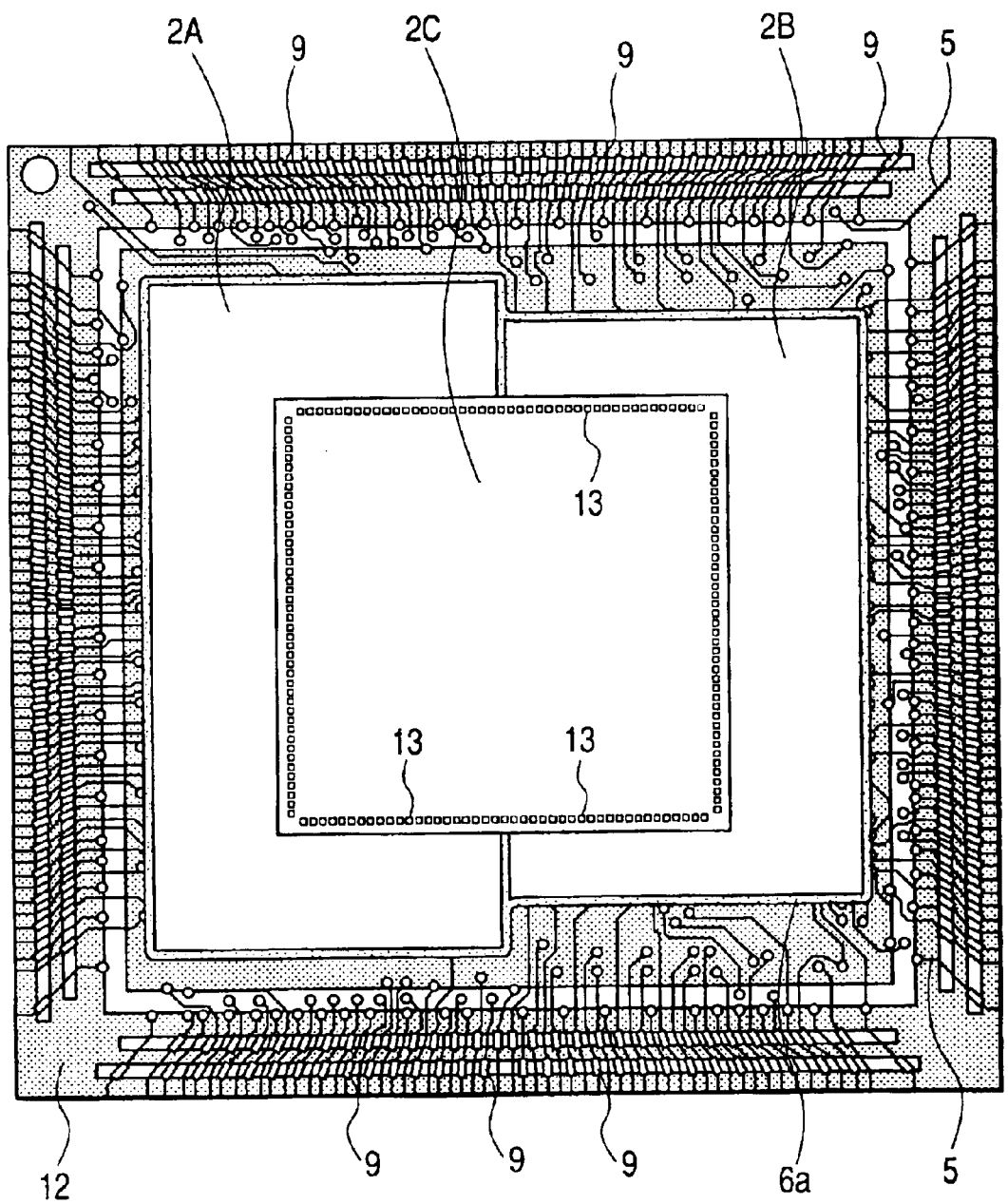
FIG. 17 is an enlarged plan view of a principal portion of the multi-wiring substrate, showing the semiconductor device manufacturing method.
Figure 18:
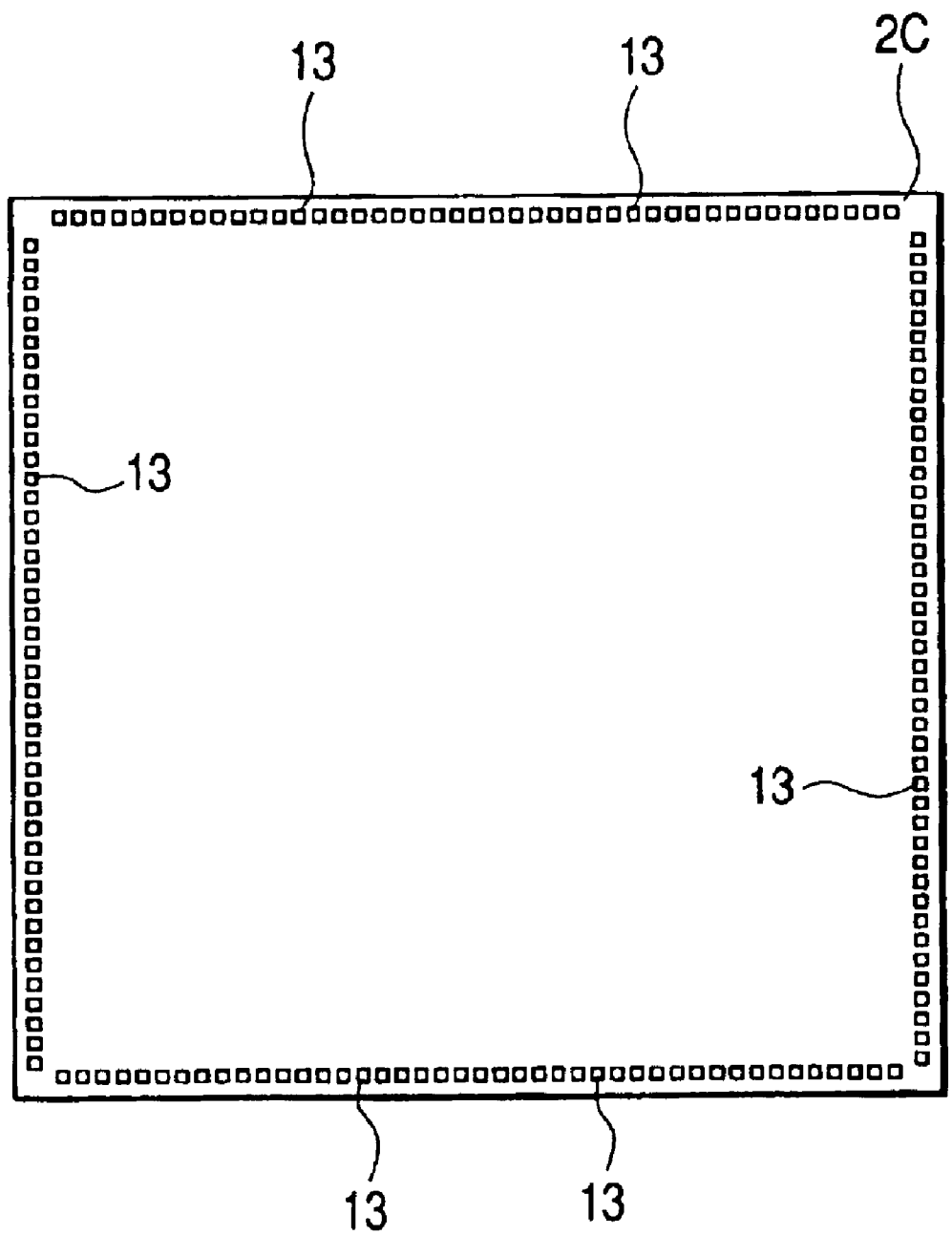
FIG. 18 is a plan view of a semiconductor chip used in manufacturing the semiconductor device.

Next, as shown in FIGS. 16 and 17, the chip 2C is placed on the two chips 2A and 2B. As shown in FIG. 18, bonding pads 13 are formed along the four sides of the main surface of the chip 2C with a microprocessor formed thereon. The number of the bonding pads 13 is larger than that of the bonding pads formed on the chips 2A and 2B.

Figure 19:
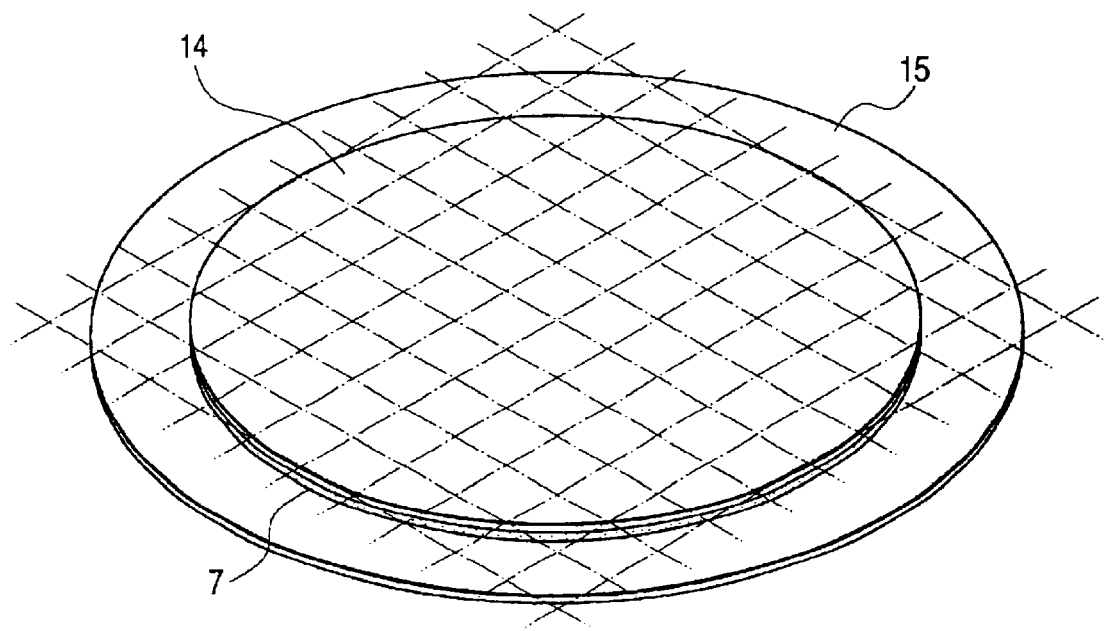
FIG. 19 is a perspective view of a semiconductor wafer, showing the semiconductor device manufacturing method.
Figure 20:
FIG. 20 is a side view thereof.

The chip 2C is disposed centrally of each package substrate forming area so that the lengths of Au wires 8 which connect the multi-wiring substrate 100 and the chip 2C with each other become as uniform as possible. A tape-like adhesive 7, which is cut to the same size as the chip 2C, is affixed beforehand to the back side of the chip 2C. For affixing the tape-like adhesive 7 to a back side of the chip 2C, for example as shown in FIGS. 19 and 20, the tape-like adhesive 7 is sandwiched in between wafer 14 and dicing tape 15 at the time of affixing the dicing tape 15 to a back side of the wafer 14 after completion of the ordinary wafer process, and in this state the wafer 14 is diced to obtain the chip 2C. By subsequent removal of the dicing tape 15 from the back side of the chip 2C there remains the adhesive 7 of the same size as the chip 2C on the back side of the chip 2C. As the adhesive 7 there is used a polyimide resin-based adhesive for example.

Next, the multi-wiring substrate 100 is heated at 180° C. for about 1 hour within a heating furnace. With this heattreatment, the adhesive 7 softens and the chip 2C is thereby bonded onto the chips 2A and 2B.

Figure 21:
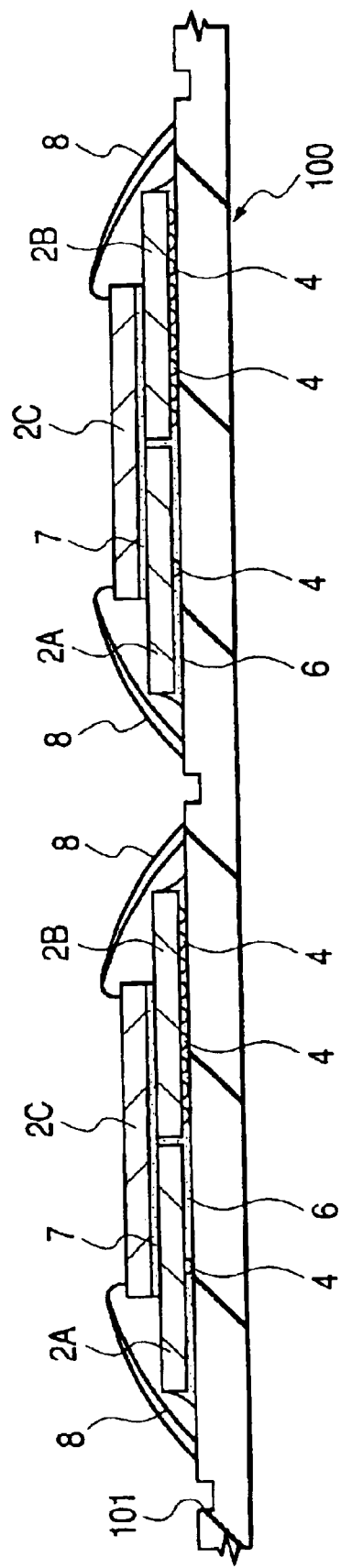
FIG. 21 is an enlarged sectional view of a principal portion of the multi-wiring substrate, showing the semiconductor device manufacturing method.
Figure 22:
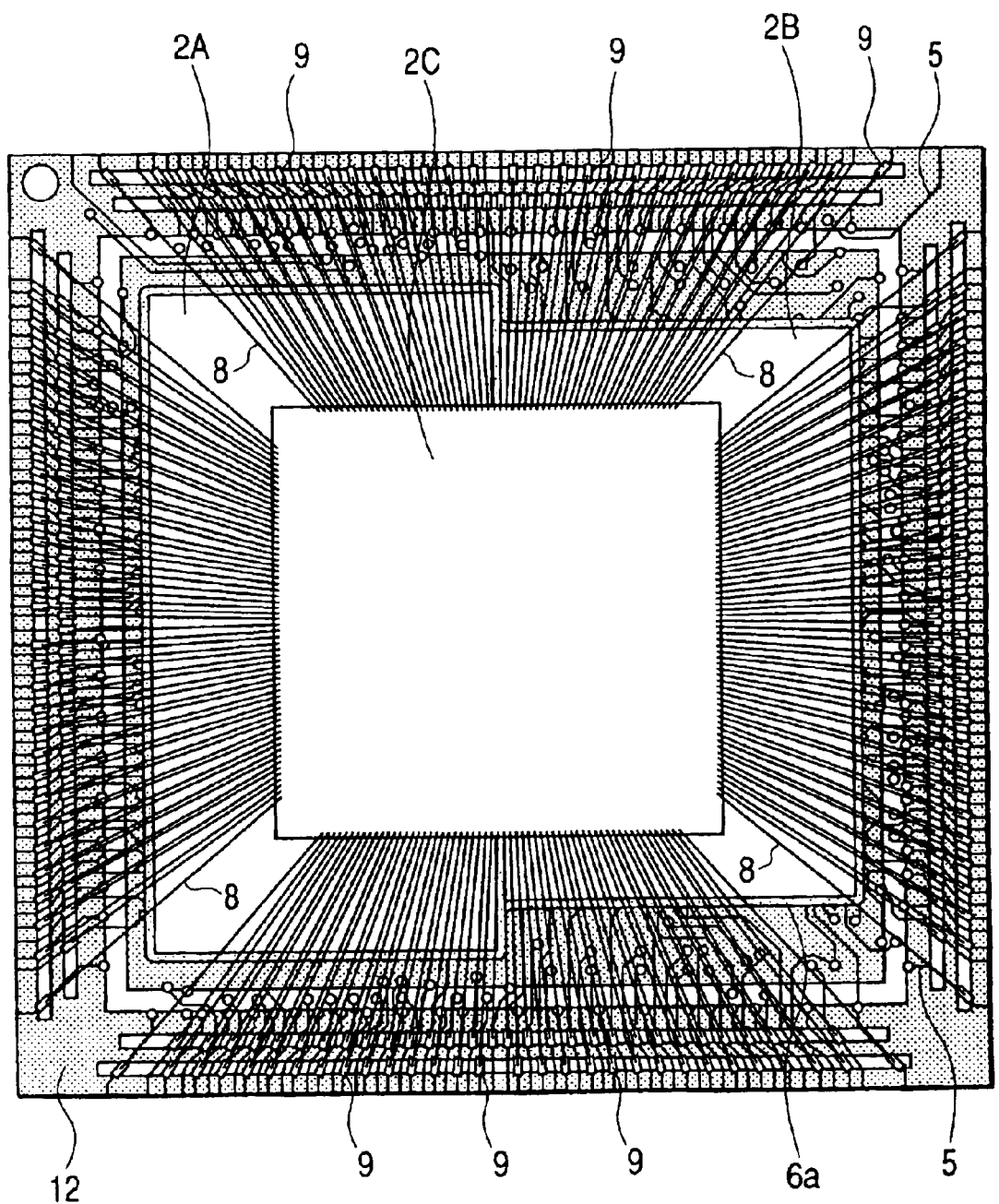
FIG. 22 is an enlarged plan view of a principal portion of the multi-wiring substrate, showing the semiconductor device manufacturing method.

Then, as shown in FIGS. 21 and 22, the bonding pads 9 on the multi-wiring substrate 100 and the bonding pads 13 (not shown in FIGS. 21 and 22) of the chip 2C are connected together through Au wires 8. The connection of Au wires 8 is performed by using, for example, a wire bonder which utilizes both ultrasonic oscillation and thermocompression bonding.

Figure 23:
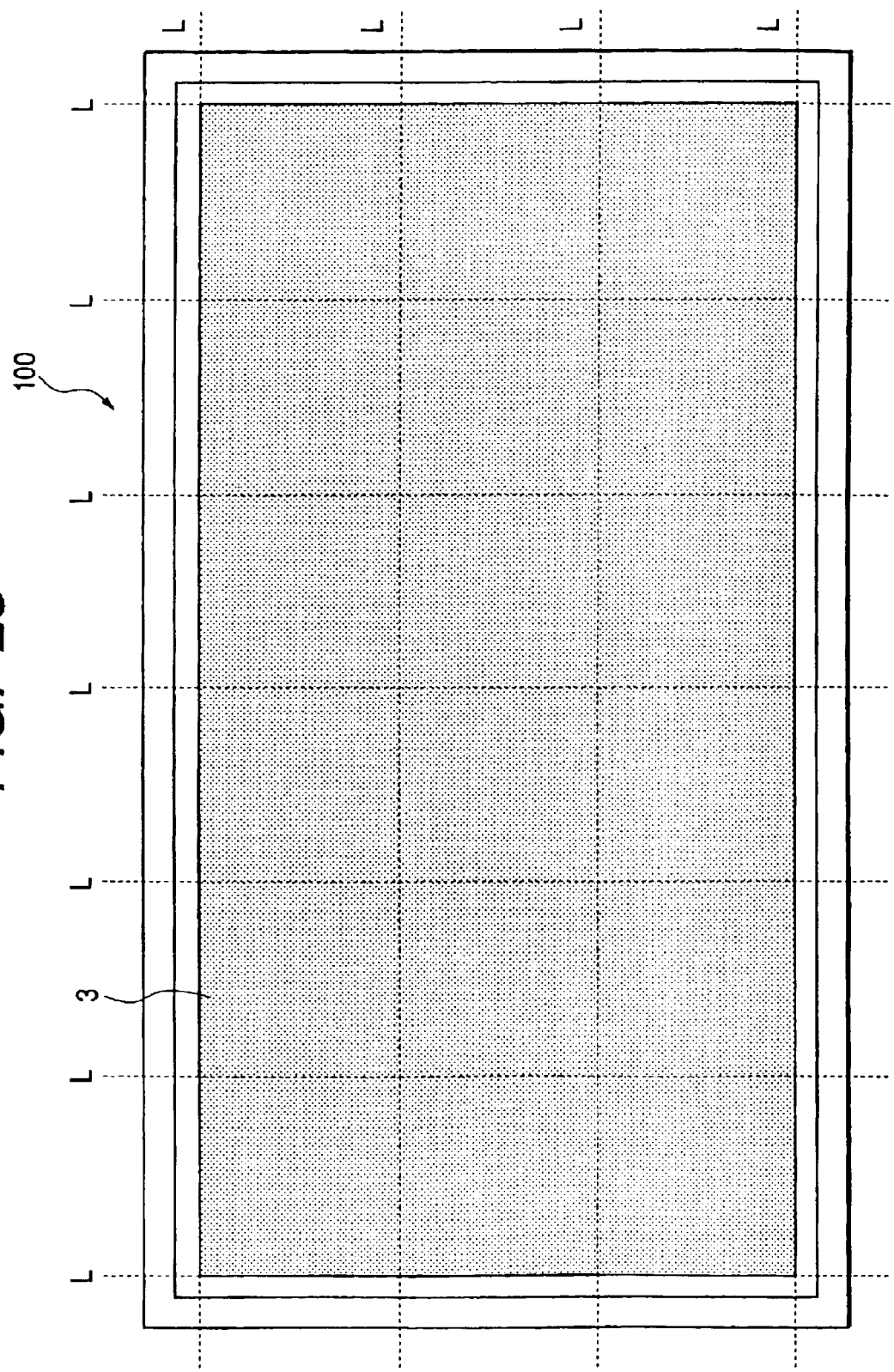
FIG. 23 is a plan view of the multi-wiring substrate, showing the semiconductor device manufacturing method.
Figure 24:
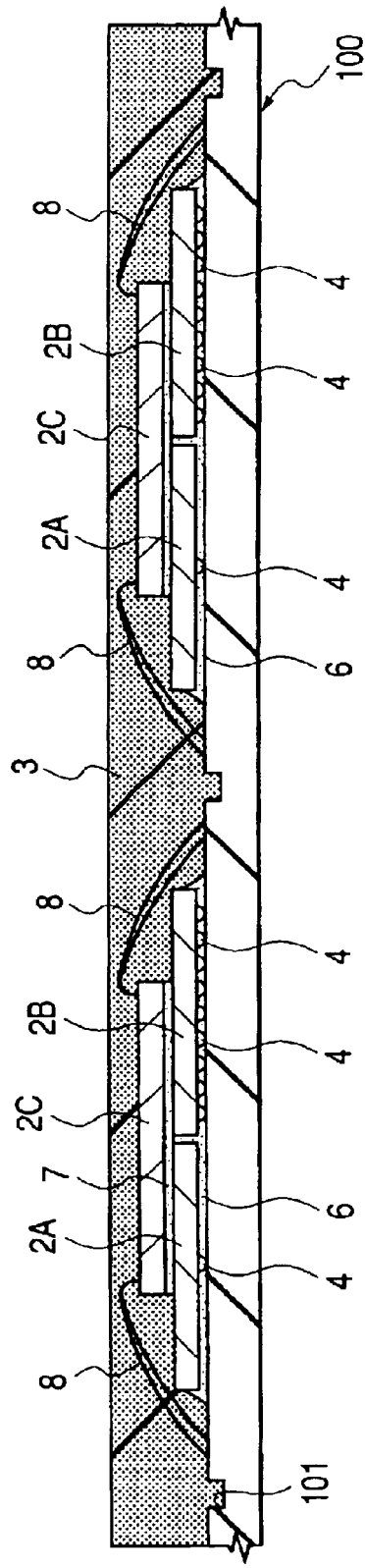
FIG. 24 is an enlarged sectional view of a principal portion of the multi-wiring substrate, showing the semiconductor device manufacturing method.

Next, as shown in FIGS. 23 and 24, the multi-wiring substrate 100 is loaded into a molding die (not shown) and the whole of its main surface is sealed with molding resin 3. For example, the molding resin 3 is a thermosetting epoxy resin with silica about 70 to 100 μm in particle diameter dispersed therein.

Figure 25:
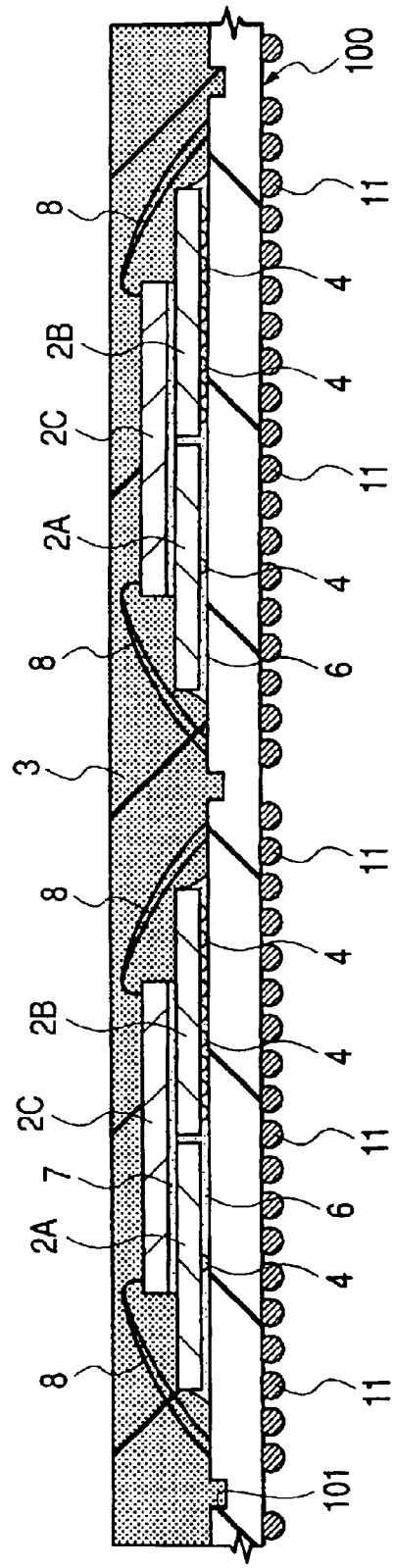
FIG. 25 is an enlarged sectional view of a principal portion of the multi-wiring substrate, showing the semiconductor device manufacturing method.

Then, as shown in FIG. 25, solder bumps 11 are connected to the electrode pads (not shown in FIG. 25) formed on the back side of the multi-wiring substrate 100. The connection of the solder bumps 11 is performed by supplying solder balls of, for example, a low-melting Pb—Sn eutectic alloy to the surfaces of the electrodes pads 9 and by subsequently allowing the solder balls to reflow.

Figure 26:
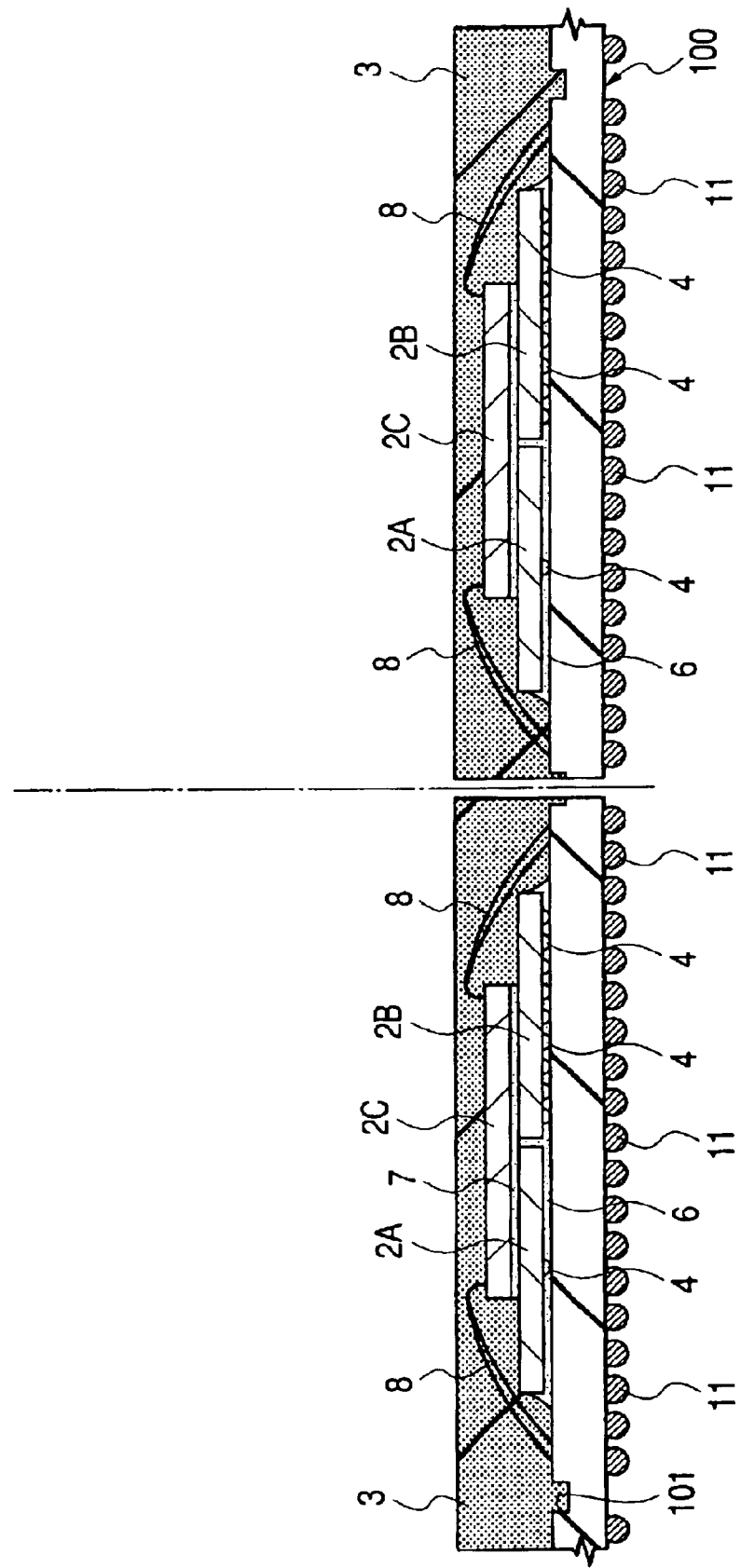
FIG. 26 is an enlarged sectional view of a principal portion of the multi-wiring substrate, showing the semiconductor device manufacturing method.

Next, as shown in FIG. 26, the multi-wiring substrate 100 is diced into individual substrates along dicing lines L shown in FIGS. 4 and 5, whereby the multi-chip module (MCM) of this embodiment shown in FIGS. 1 to 3 is completed.

Second Embodiment

A method of manufacturing a semiconductor device according to a second embodiment of the present invention will be described below step by step with reference to FIGS. 27 to 37.

Although in the previous first embodiment Au bumps 4 are formed on each of the main surface of the chip 2A with DRAM formed thereon and the main surface of the chip 2B with flash memory formed thereon, solder bumps 20 are used instead of Au bumps 4 in this embodiment. Further, two chips 2A with DRAM formed thereon are used in place of the combination of the DRAM-formed chip 2A and the flash memory-formed chip 2B.

In this embodiment, two types of chips 2A and 2C to be mounted on the main surface of the multi-wiring substrate 100 are compared with each other with respect to the ratio of chip area to the number of terminals, which ratio is designated "grid array index," then the chip smaller in the grid array index is mounted by the wire bonding method, while the chip larger in the grip array index is mounted by the flip-chip method. More specifically, given that the number of terminals of the first chip and that of the second chip are assumed to be $N_1$ and $N_2$, respectively, and that the area of a main surface of the first chip and that of the second chip are $S_1$ and $S_2$, respectively, then if there is established a relation of $SQRT(S_1/N_1) > SQRT(S_2/N_2)$ where SQRT stands for a square root, the first chip is mounted by the flip-chip method and the second chip is mounted by the wire bonding method. The number of chip terminals corresponds to the solder bump pitch in an array-like arranged state of solder bumps on the chip main surface. Likewise, in case of mounting three or more types of chips different in the number of terminals or area, grid array indices of those chips are calculated and the chip smallest in grid array index is mounted by the wire bonding method, while the other chips are mounted by the flip-chip method.

For example, the size of the chip 2A with DRAM formed thereon is 4.66 mm×8.22 mm, the number of terminals (bonding pads) arranged in a row centrally of the chip 2A is 64 pins, and the terminal pitch is 0.08 mm. On the other hand, as to the chip 2C with a microprocessor formed thereon, the size thereof is, as an example, 6.84 mm×6.84 mm, the number of terminals arranged along the four sides of the chip 2C is 256 pins, and the terminal pitch is 0.065 mm. In this case, as to the two types of chips 2A and 2C, calculation of their grid array indices shows that the grid array index of the chip 2C with a microprocessor formed thereon is the smaller. In this embodiment, therefore, the chip 2C is mounted by the wire bonding method and the chip 2A is mounted by the flip-chip method.

Figure 27:
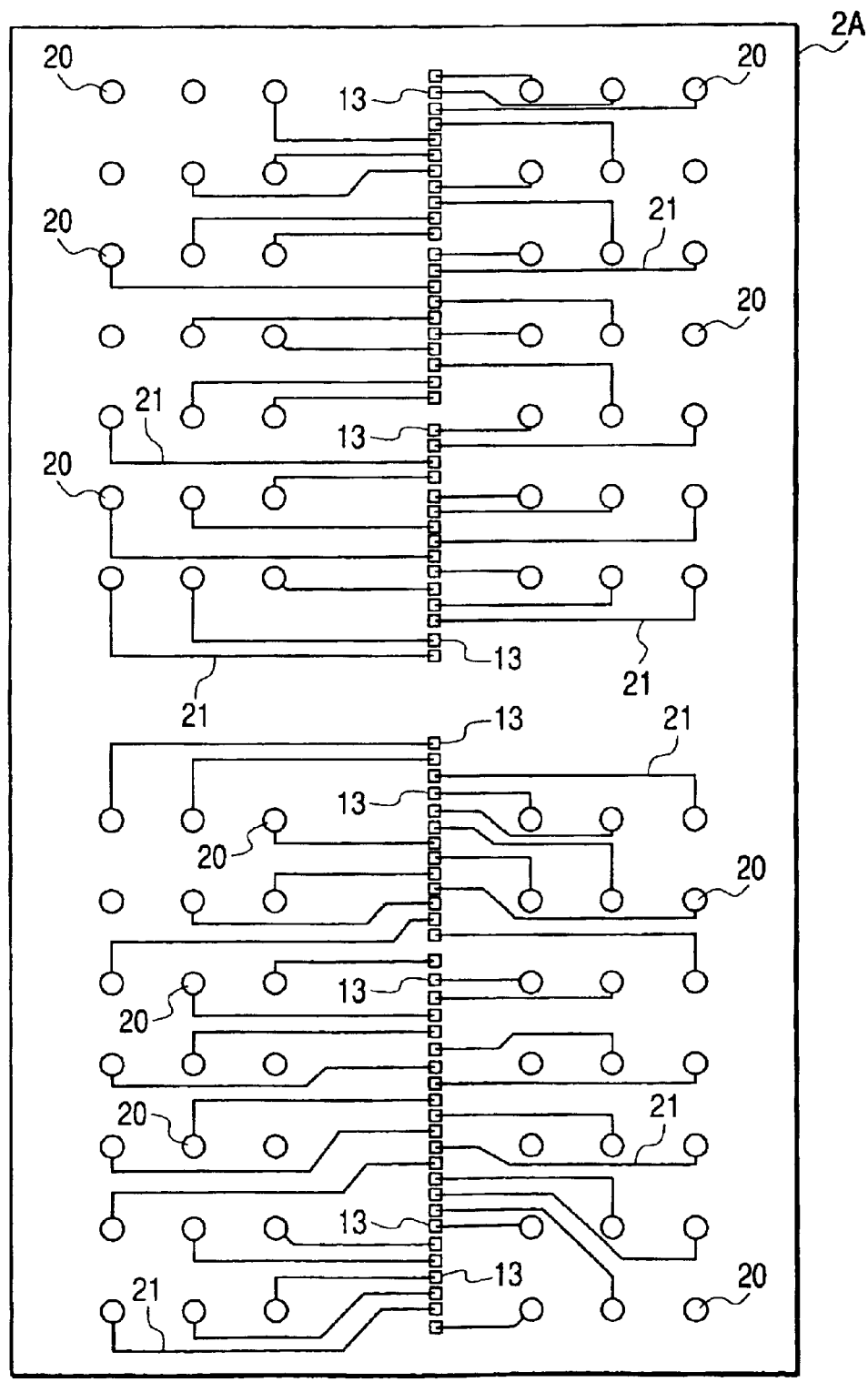
FIG. 27 is a plan view of a semiconductor chip used in manufacturing a semiconductor device according to another embodiment of the present-invention.

FIG. 27 is a plan view showing a state in which solder bumps 20 are formed on the main surface of the DRAM-formed chip 2A. As shown in the same figure, the solder bumps 20 are arranged in an array form on the main surface of the chip 2A. Bonding pads 13 and solder bumps 20 are electrically with each other through Cu wires 21. The Cu wires 21 function as an interposer for changing the pitch of the bonding pads 13 into the pitch of the solder bumps 20, whereby the latter pitch can be made wider than the former pitch.

Figure 28:
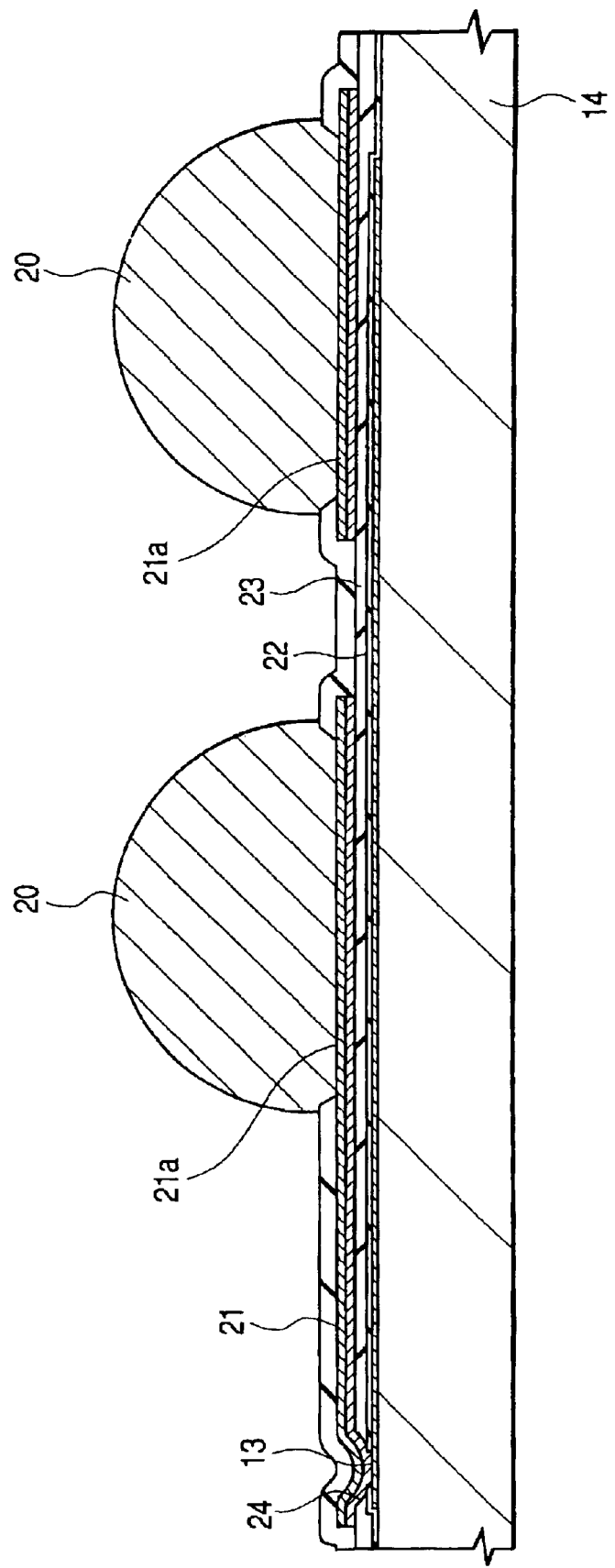
FIG. 28 is an enlarged sectional view of a principal portion of a semiconductor wafer, showing a method of manufacturing the semiconductor device.

The Cu wires and the solder bumps 20 are formed in the final step of wafer process by utilizing the wafer level CSP technique. More specifically, as shown in FIG. 28, an organic insulating film 23 such as a polyimide resin film is formed on a surface protecting film 22 of wafer 14 and thereafter Cu wires 21 are formed on the organic insulating film 23 by the electrolytic plating method for example. The Cu wires 21 and the bonding pads 13 are electrically connected with each other through through-holes 24 formed in the organic insulating film 23 on the bonding pads 13. The solder bumps 20 are formed by printing solder paste onto surfaces of electrode pads 21a as one ends of Cu wires 21 and by subsequently heating the wafer 14 to melt the solder paste. For example, the solder bumps 20 are formed of Pb—Sn alloy (liquidus temperature: 320 to 325° C.) containing 20% Sn.

Figure 29:
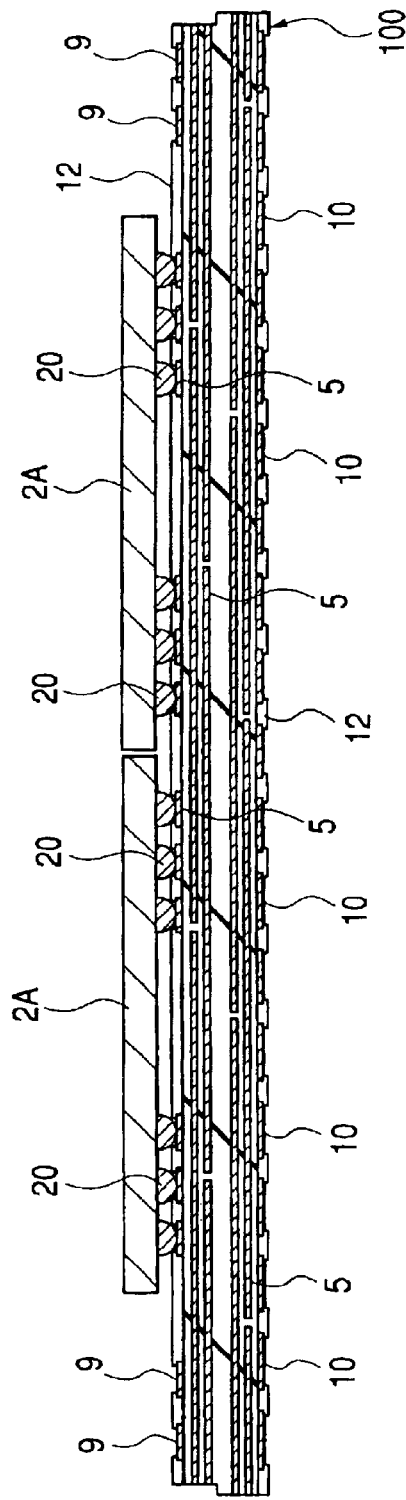
FIG. 29 is an enlarged sectional view of a principal portion of a multi-wiring substrate, showing the semiconductor device manufacturing method.

Next, as shown in FIG. 29, two chips 2A are positioned in each package substrate forming area of the multi-wiring substrate 100 by the face-down method and thereafter the multi-wiring substrate 100 is heated to let the solder bumps 20 reflow, thereby connecting the solder bumps 20 of the chips 2A and wires 5 of the multi-wiring substrate electrically with each other.

Figure 30:
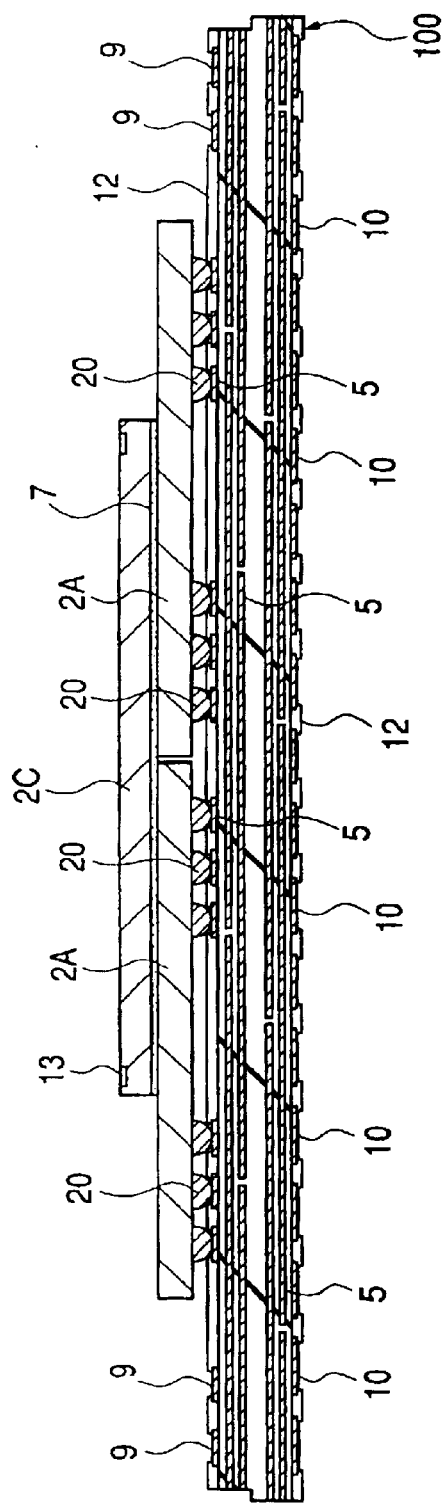
FIG. 30 is an enlarged sectional view of a principal portion of the multi-wiring substrate, showing the semiconductor device manufacturing method.

Next, as shown in FIG. 30, the chip 2C is placed and bonded onto the two chips 2A using the adhesive 7 affixed to the back side of the chip 7C in the same manner as in the previous first embodiment.

Figure 31:
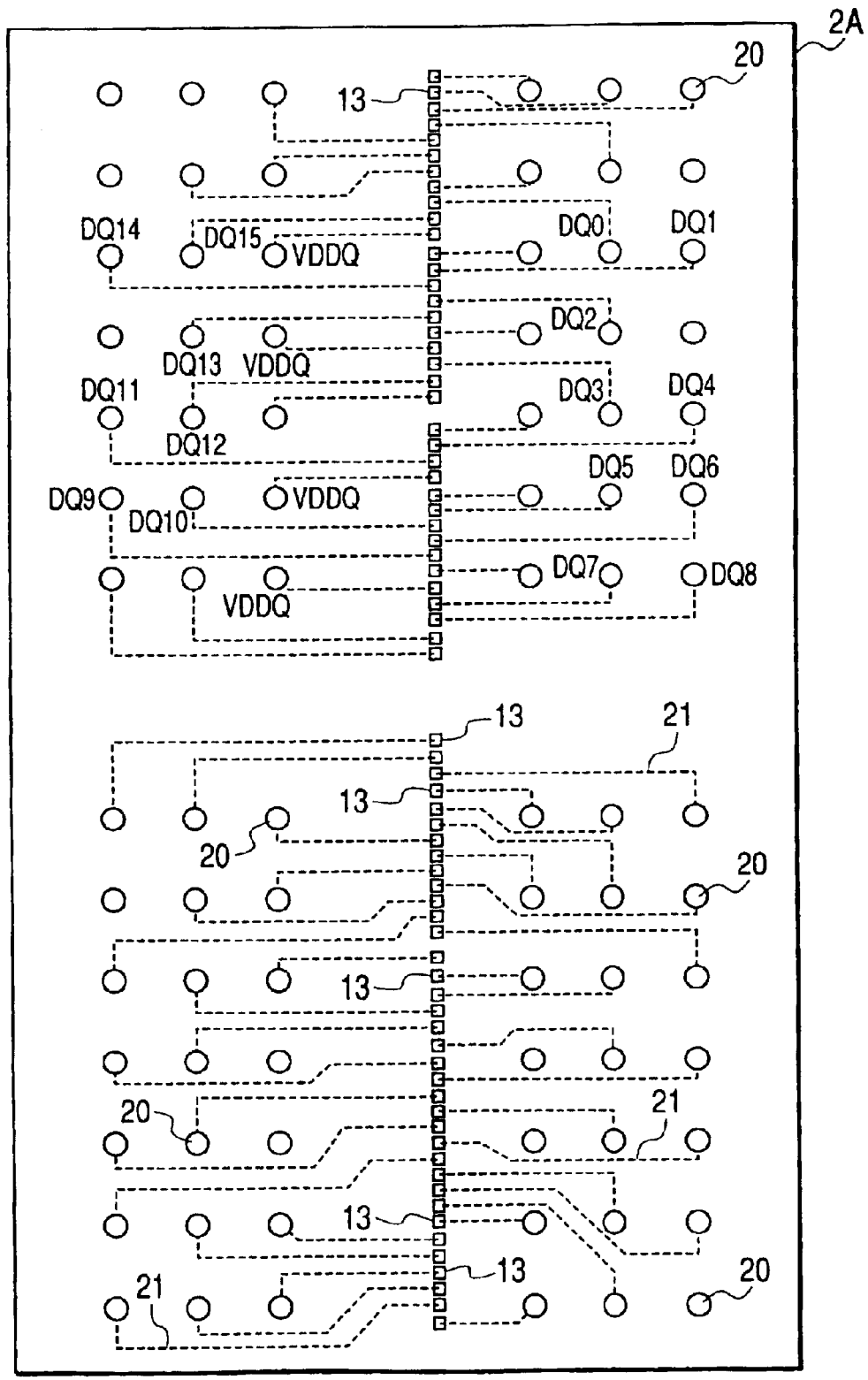
FIG. 31 is a plan view showing a terminal array on a semiconductor chip with a DRAM formed thereon.
Figure 32:
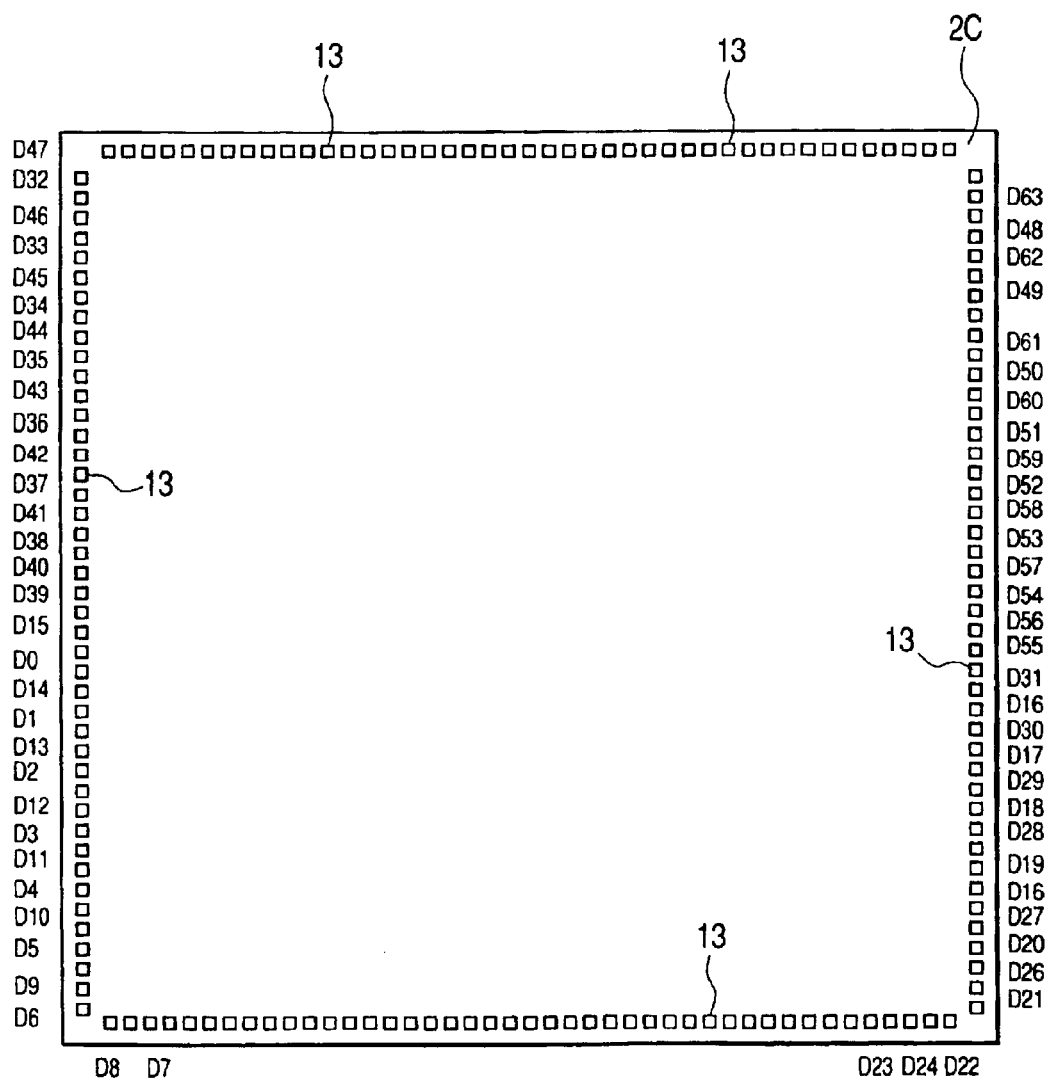
FIG. 32 is a plan view showing a terminal array on a semiconductor chip with a microprocessor formed thereon.
Figure 33:
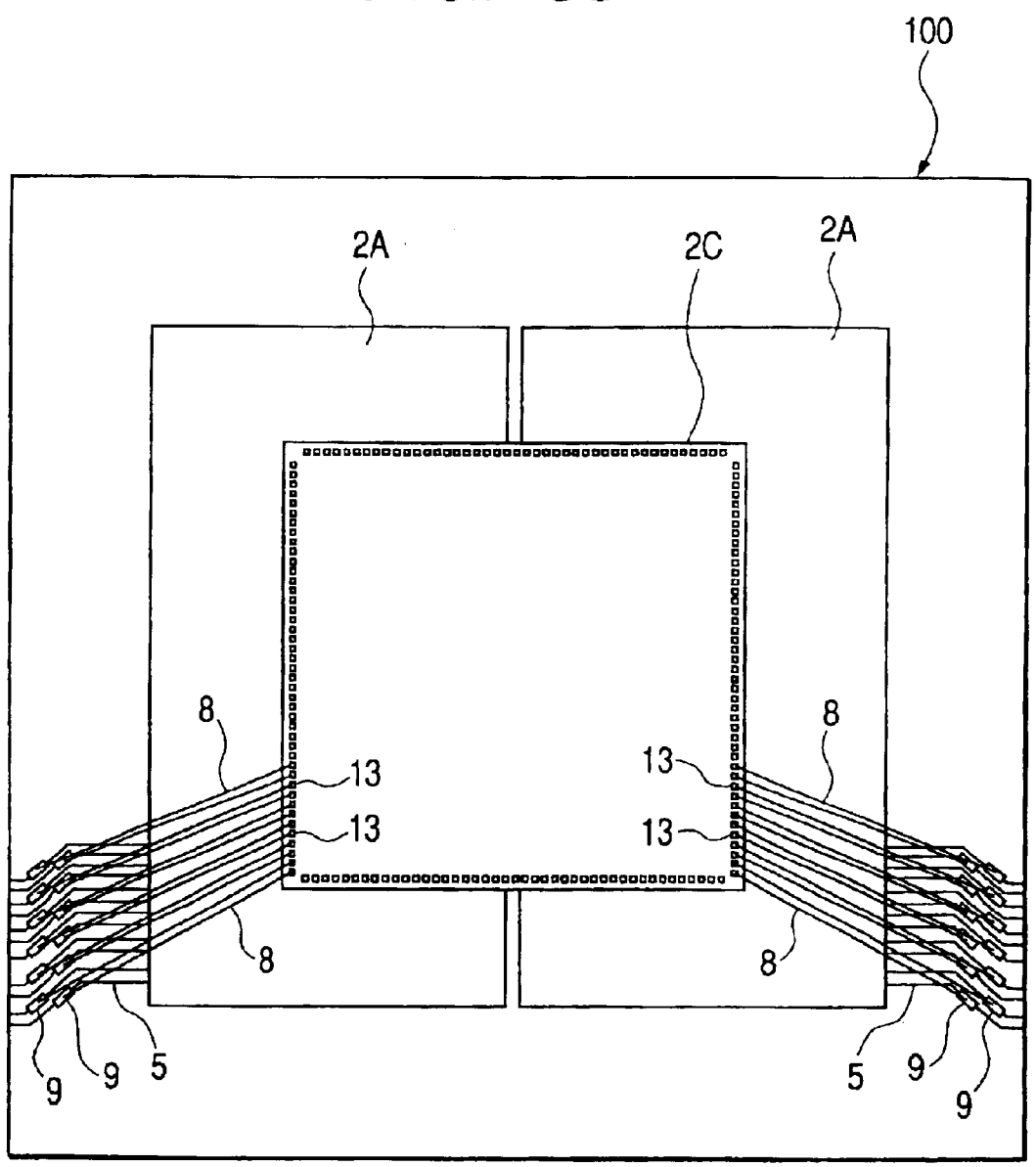
FIG. 33 is an enlarged plan view of a principal portion of a multi-wiring substrate, showing the semiconductor device manufacturing method.
Figure 34:
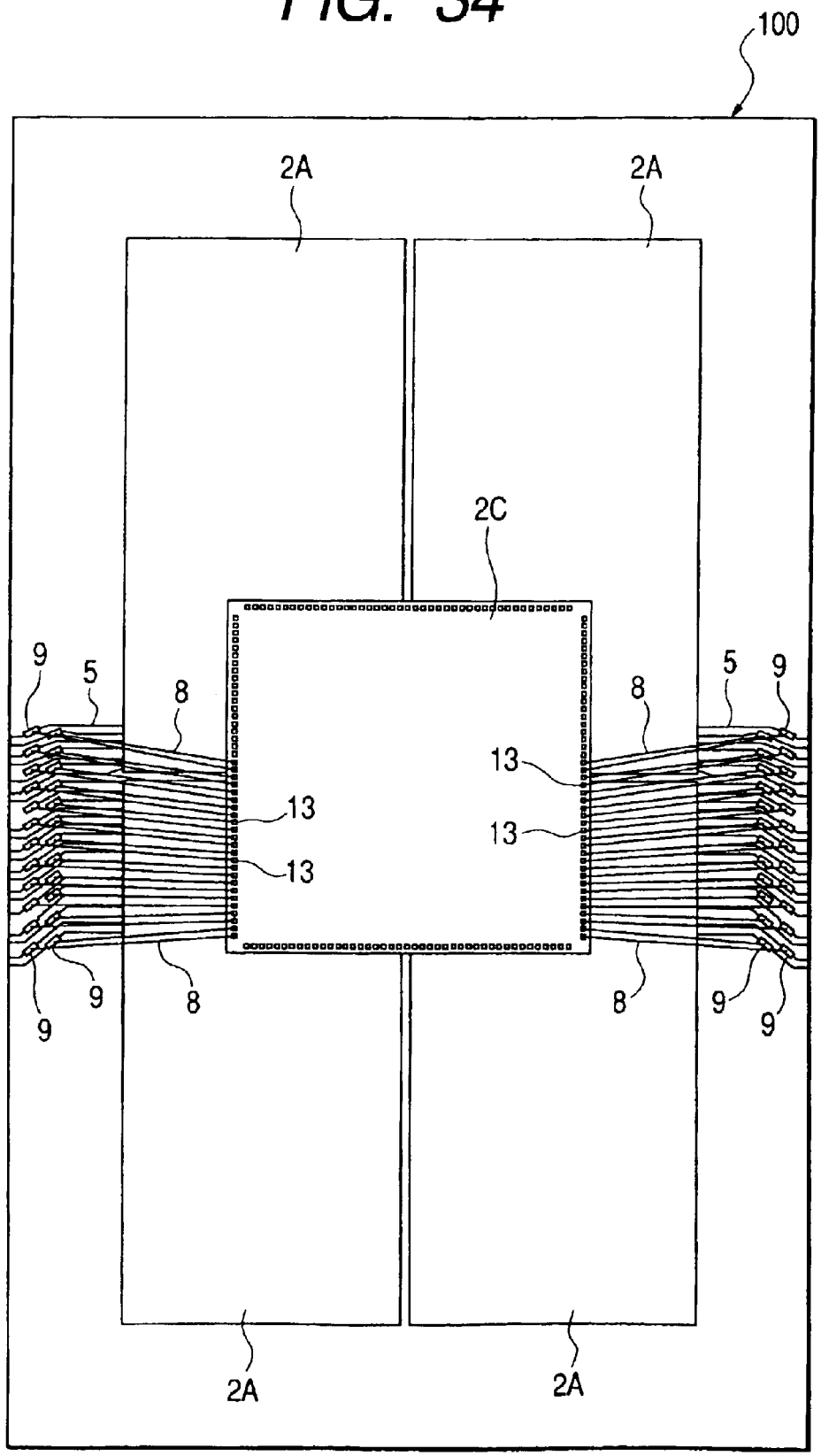
FIG. 34 is an enlarged plan view of a principal portion of a multi-wiring substrate, showing the semiconductor device manufacturing method.

FIG. 31 is a plan view showing an arrangement of terminals on each chip 2A and FIG. 32 is a plan view showing an arrangement of terminals on the chip 2C. As shown in both figures, DQ pins (data output pins) of each chip 2A are concentrated in a specific area of the chip main surface and so are DQ pins of the chip 2C. Preferably, therefore, the chip 2C is disposed on the chips 2A at a position at which common DQ pins common of the chips 2A and 2C are the closest to each other. With this arrangement, as shown in FIG. 33, the lengths of Au wires 8 which interconnect DQ pins can be made almost equal to one another, so that the wiring effect of the wires 8 is improved. Pads 13 which overlie DQ pins (0 to 15) are I/O pins, while underlying pads 13 are address pins, and VDD pins are power or GND pins. FIG. 34 shows an example of an optimum arrangement for placing one microprocessor-formed chip 2C onto four DRAM-formed chips 2A.

Next, as shown in FIG. 35, a liquid underfill resin 6 is fed around chips 2A with use of a dispenser or the like and is thereafter heat-cured to fill the gap between the chips 2A and the multi-wiring substrate 100 and the gap between the chips 2A with the resin 6.

Figure 37:
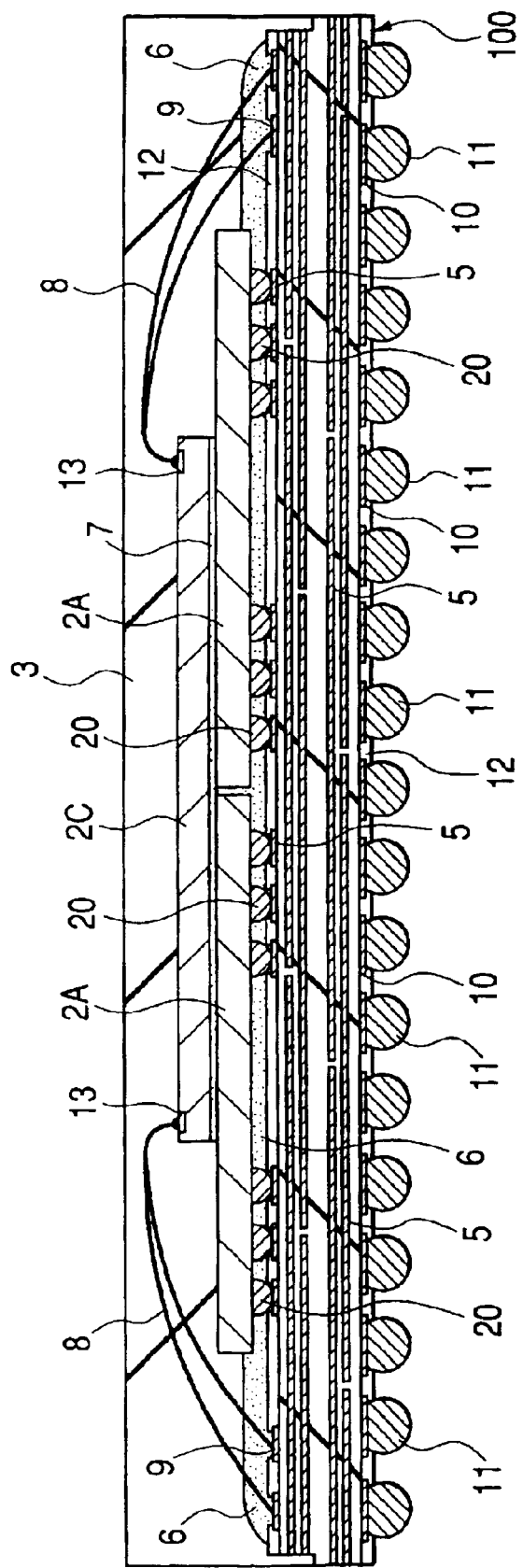
FIG. 37 is an enlarged sectional view of a principal portion of the multi-wiring substrate, showing the semiconductor device manufacturing method.

Then, as shown in FIG. 36, the multi-wiring substrate 100 is loaded into a molding die (not shown) and the whole of the main surface of the multi-wiring substrate is sealed with resin. Thereafter, as shown in FIG. 37, solder bumps 11 are connected to electrode pads 9 formed on the back side of the multi-wiring substrate 100. Subsequently, though not shown, the multi-wiring substrate 100 is diced in the same manner as in the first embodiment to complete the multi-chip module (MCM) of this embodiment.

Although the present invention has been described above by way of the above embodiments, it goes without saying that the present invention is not limited to the above embodiments, but that various changes may be made within the scope not departing from the gist of the invention.

Figure 38:
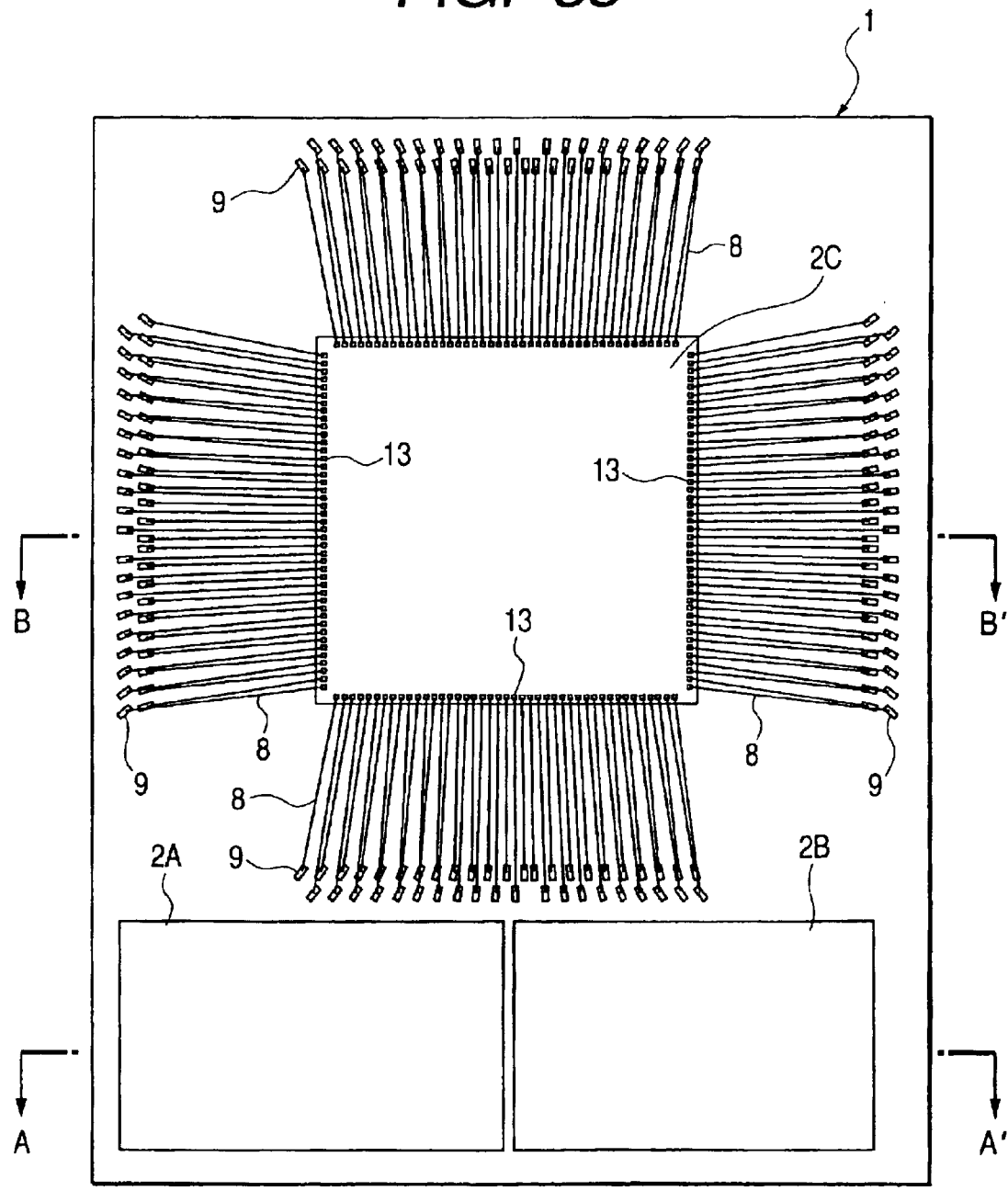
FIG. 38 is a plan view of a semiconductor device according to a further embodiment of the present invention.
Figure 39:
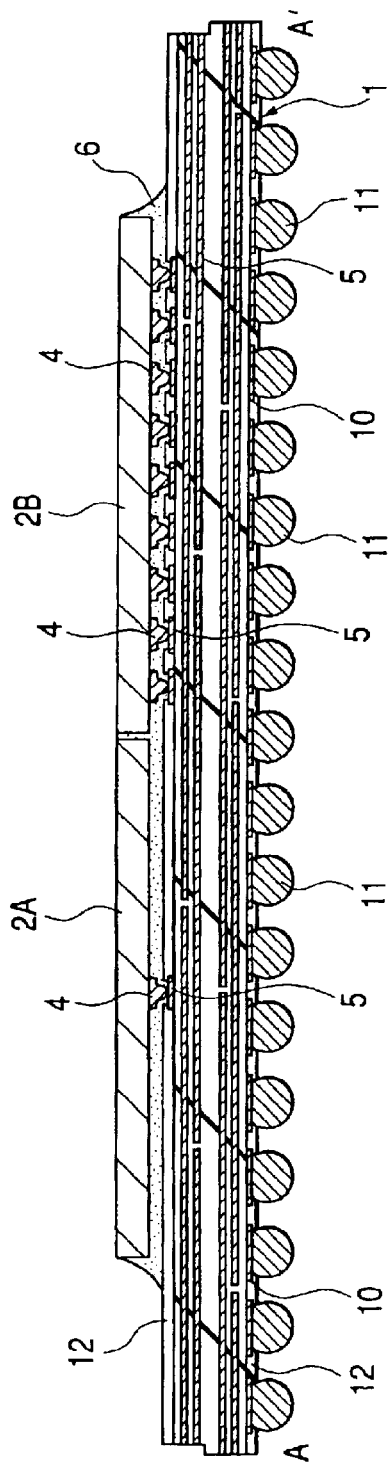
FIG. 39 is a sectional view taken along line A–A' of FIG. 38.
Figure 40:
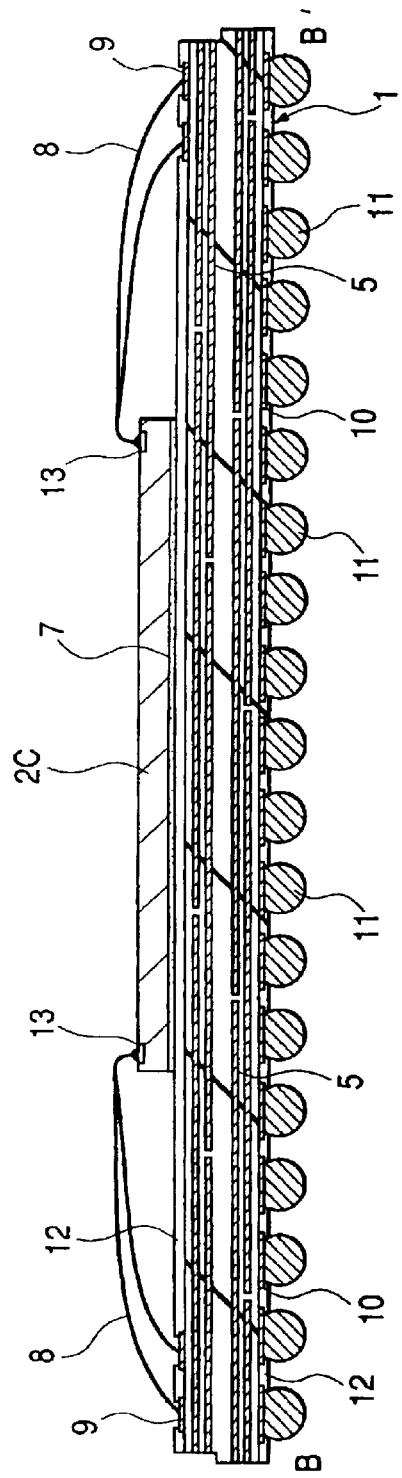
FIG. 40 is a sectional view taken along line B–B' of FIG. 38.
Figure 41:
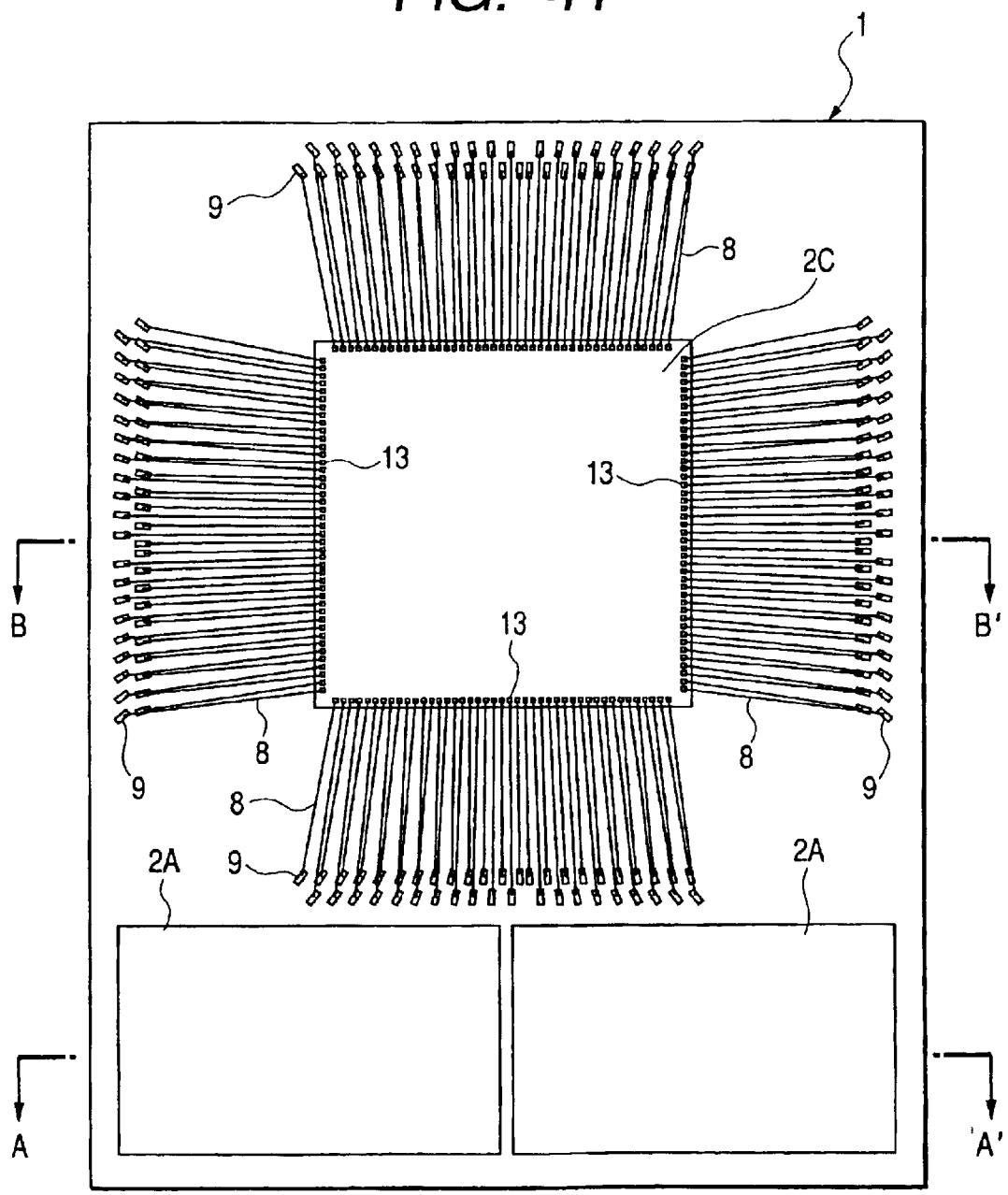
FIG. 41 is a plan view of a semiconductor device according to a still further embodiment of the present invention.
Figure 44:
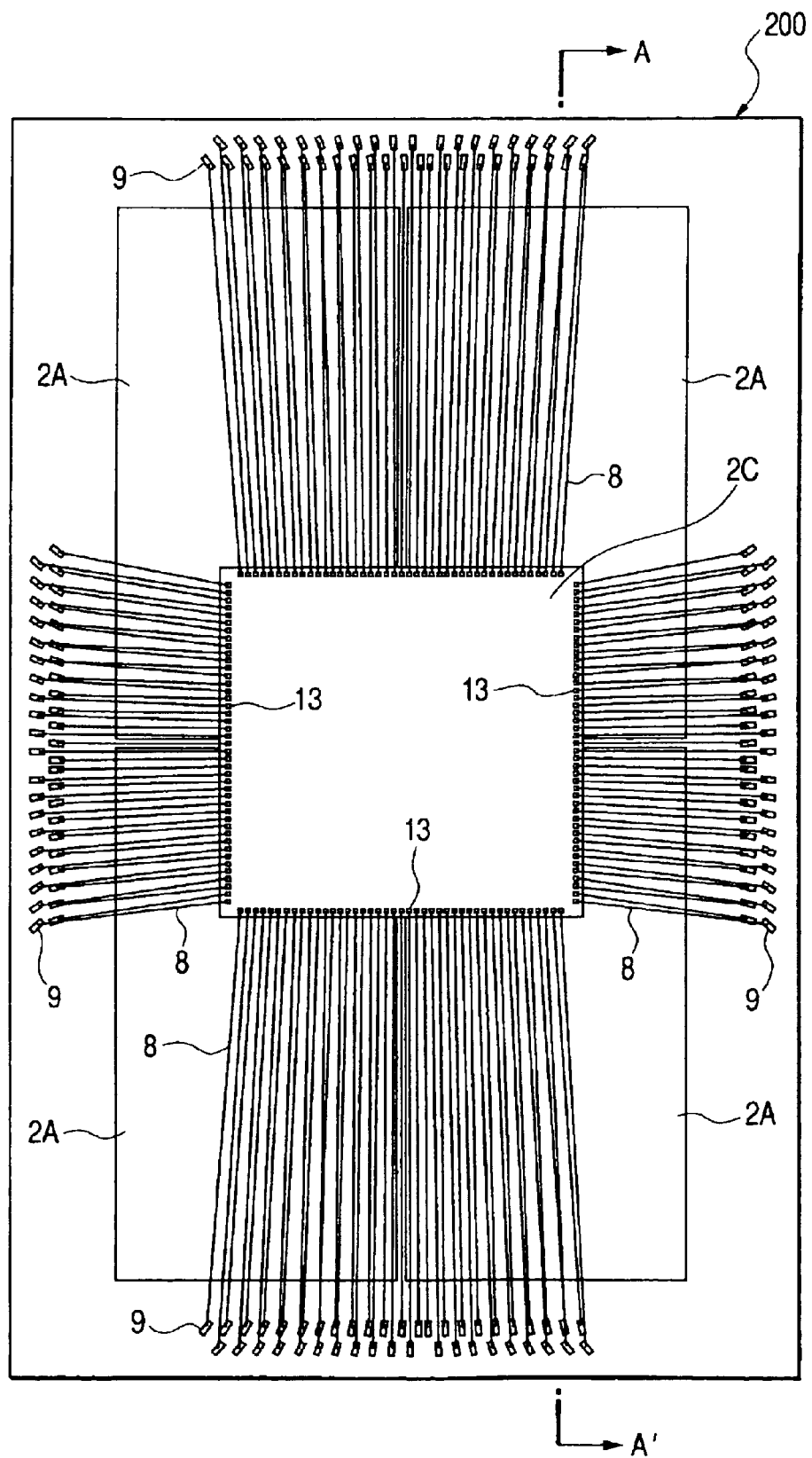
FIG. 44 is a plan view of a semiconductor device according to a still further embodiment of the present invention.
Figure 45:
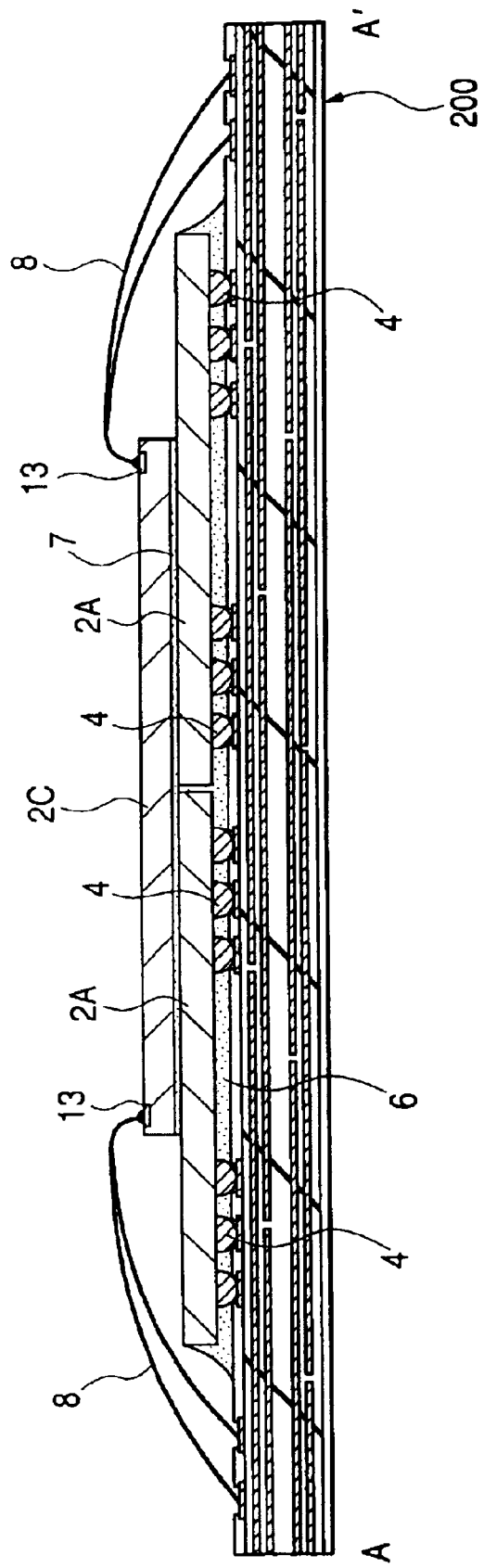
FIG. 45 is a sectional view taken along line A–A' of FIG. 44.
Figure 46:
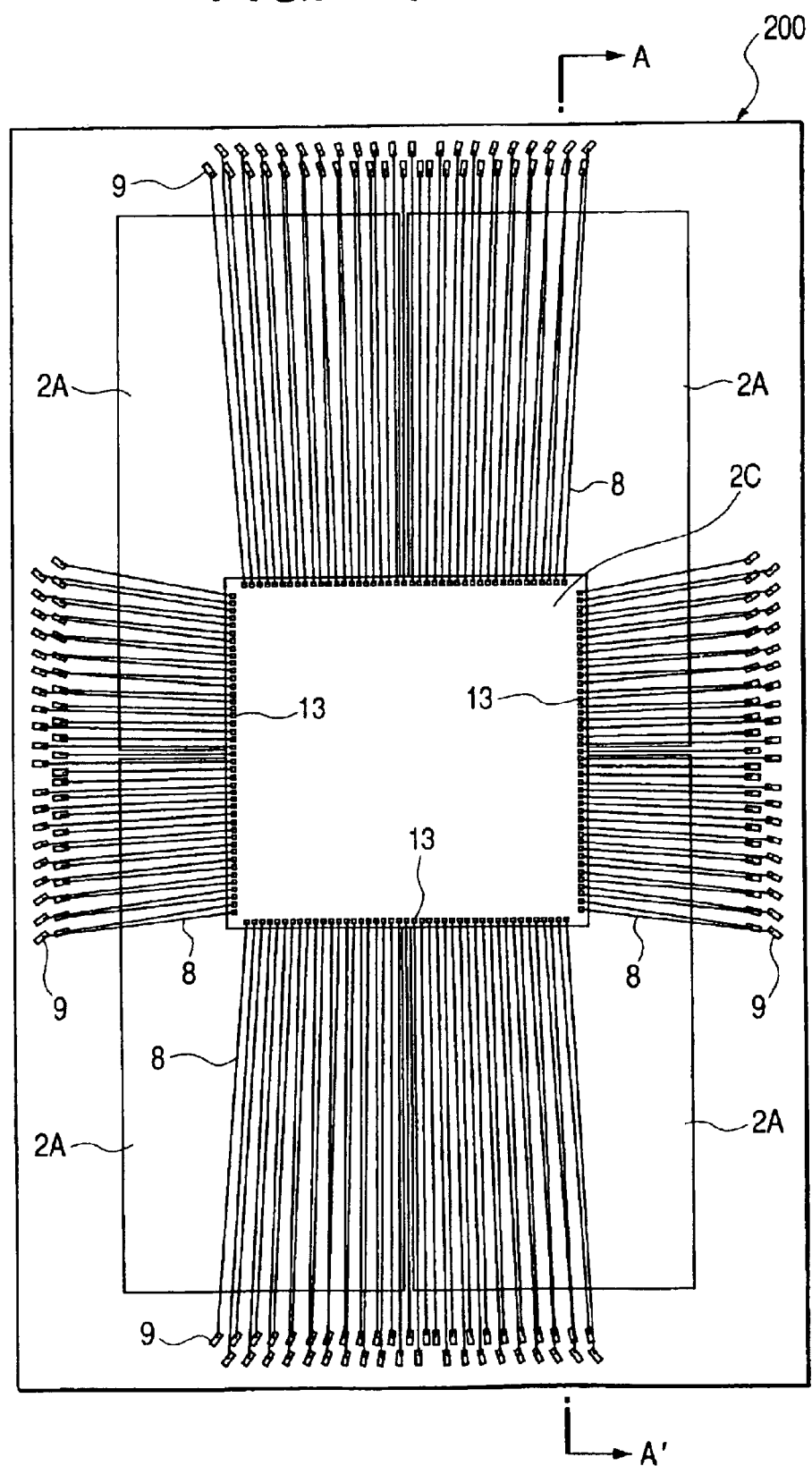
FIG. 46 is a plan view of a semiconductor device according to a still further embodiment of the present invention.
Figure 47:
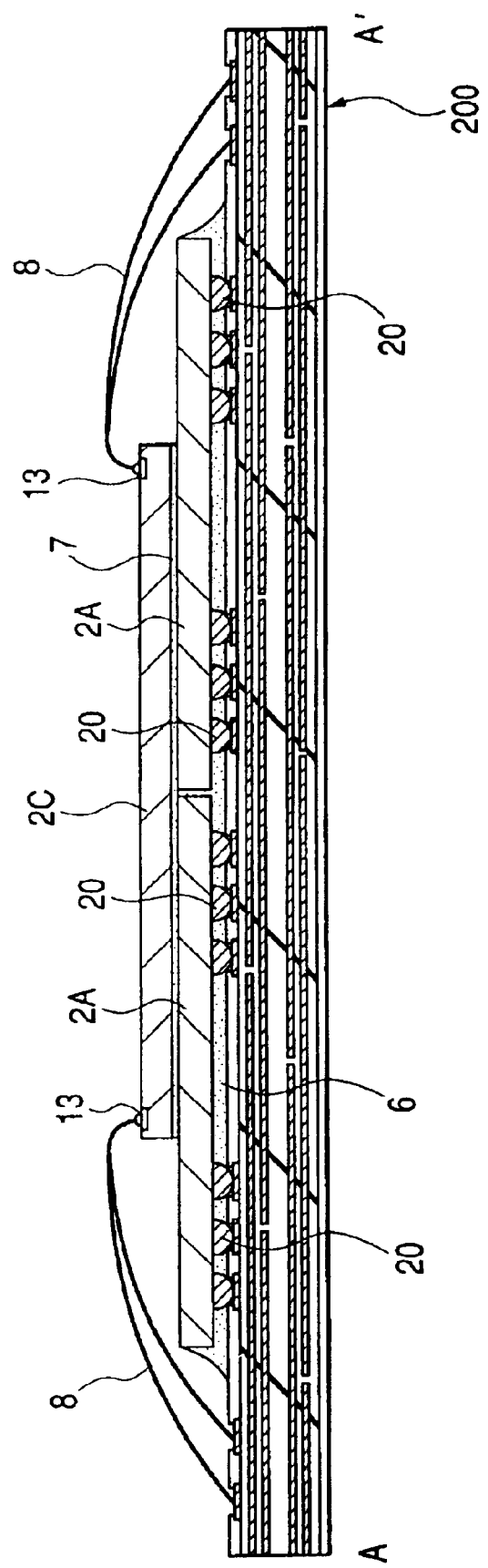
FIG. 47 is a sectional view taken along line A–A' of FIG. 46.
Figure 48:
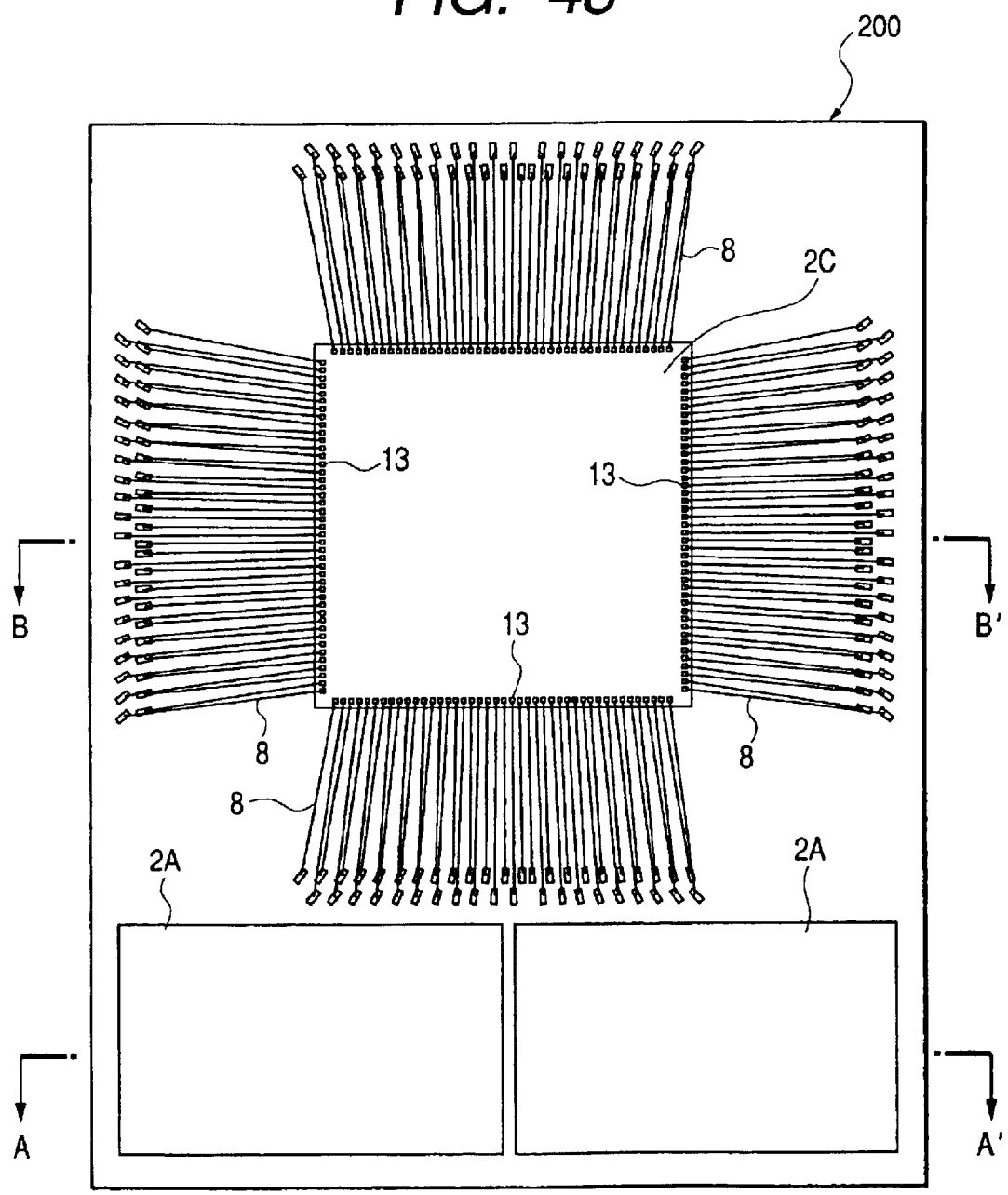
FIG. 48 is a plan view of a semiconductor device according to a still further embodiment of the present invention.
Figure 49:
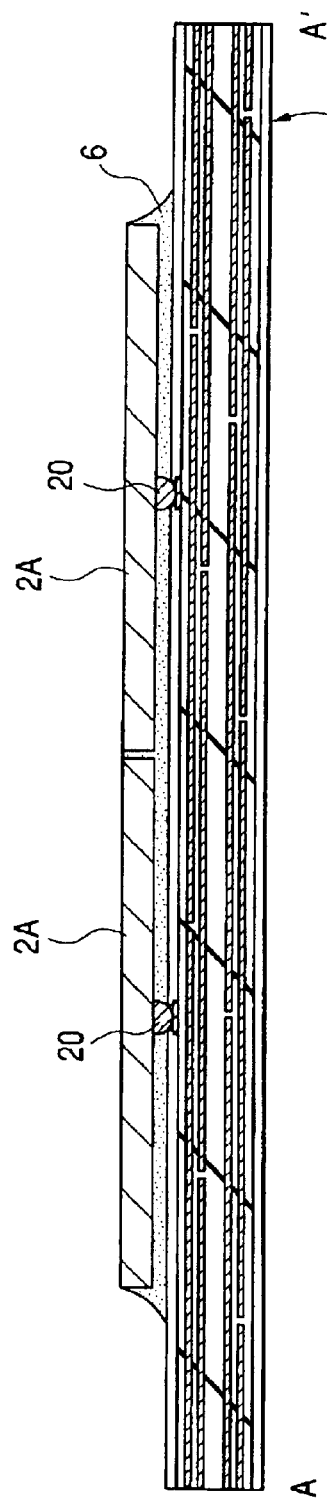
FIG. 49 is a sectional view taken along line A–A' of FIG. 48.
Figure 50:
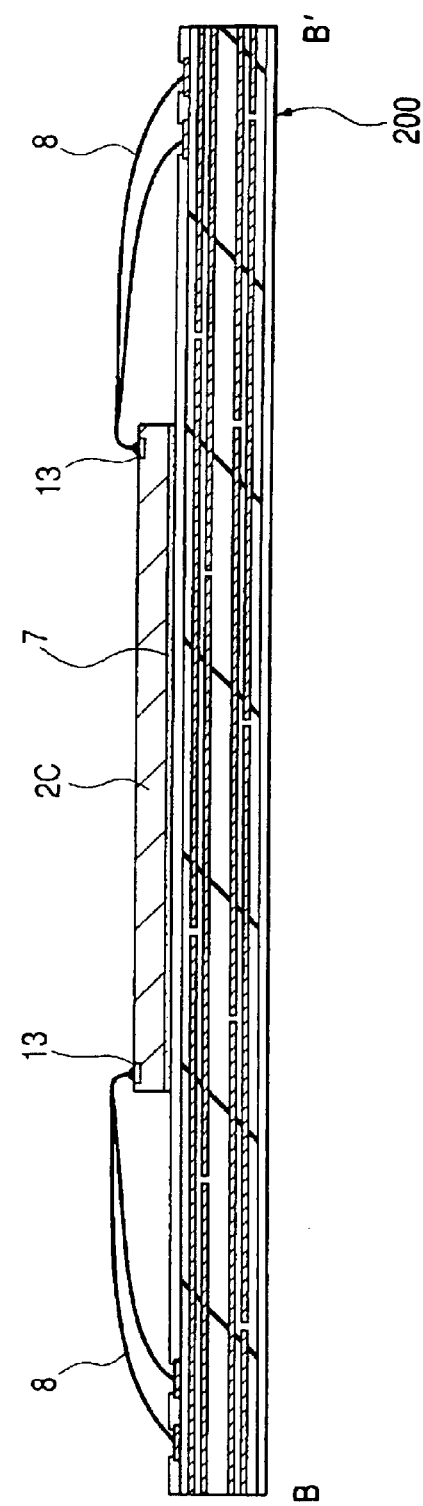
FIG. 50 is a sectional view taken along line B–B' of FIG. 48.

In the above embodiments the chip 2C which is mounted by the wire bonding method is disposed on the chip 2A (or 2B) which is mounted by the flip-chip method, but if even an increase in the mounting area of the package substrate 1 poses no problem, the chip 2C mounted by the wire bonding method may be disposed sideways of the chip 2A (or 2B) mounted by the flip-chip method, as shown in FIGS. 38 to 40 or FIGS. 41 to 43. FIGS. 38 to 40 show a combined example of the chips 2A, 2B, and 2C used in the first embodiment, while FIGS. 41 to 43 show a combined example of the chips 2A and 2C used in the second embodiment.

Moreover, as shown in FIGS. 44 to 50, instead of mounting plural chips on a package substrate, plural chips may be mounted directly on a package substrate-mounting mother board 200. In the example shown in FIGS. 44 and 45, terminals of each chip 2A mounted by the flip-chip method are constituted by Au bumps 4. In the example shown in FIGS. 46 and 47, terminals of each chip 2A mounted by the flip-chip method are constituted by solder bumps 20 and are arranged in an array form on the main surface of the chip. Further, in the example shown in FIGS. 48 to 50, the chip 2C mounted by the wire bonding method is disposed sideways of the chip 2A mounted by the flip-chip method.

On the package substrate there can be mounted small electronic parts other than chips, such as capacitor and resistor. For example, by disposing a chip capacitor along an outer periphery of a memory chip it is possible diminish noise generated while the memory chip is ON and thereby possible to attain a high-speed operation.

The present invention does not exclude the use of a build-up substrate as the package substrate for the mounting of chips thereon. In using a build-up substrate, the application of the present invention permits the use of a build-up substrate having a wider wiring pitch and therefore it is possible to reduce the multi-chip module manufacturing cost in comparison with the use of an expensive build-up substrate having a narrow wiring pitch.

As set forth above, according to the preferred embodiments of the present invention it is possible to reduce the cost of manufacturing a multi-chip module which is manufactured by providing plural chips, stacking another chip on the plural chips, and subsequent sealing with resin.

What is claimed is:

1. A method of manufacturing a semiconductor device, comprising the steps of:

(a) providing a wiring substrate with plural wires and plural bonding pads electrically connected to the plural wires, formed on a main surface thereof, a first semiconductor chip having an integrated circuit and a plurality of first terminals formed on a main surface thereof and with plural bump electrodes formed on the plurality of first terminals respectively, and a second semiconductor chip having an integrated circuit and a plurality of second terminals formed on a main surface thereof, the bonding pads of the wiring substrate being arranged in a first pitch, the first terminals of the first semiconductor chip and plural bump electrodes also being arranged in said first pitch in a manner similar to the arrangement of the bonding pads of the wiring substrate respectively;

(b) placing the first semiconductor chip on the main surface of the wiring substrate so that the main surface thereof is opposed to the main surface of the wiring substrate, and connecting the plurality of first terminals of the first semiconductor chip and a first set of plural bonding pads of the wiring substrate with each other electrically through the plural bump electrodes;

(c) placing the second semiconductor chip on the first semiconductor chip so that a rear surface thereof is opposed to the main surface of the wiring substrate, and connecting the plurality of second terminals of the second semiconductor chip and a second set of the bonding pads of the wiring substrate with each other electrically through plural bonding wires, the second set of bonding pads being different from the first set of bonding pads; and (d) sealing the first and second semiconductor chips with resin, wherein said second terminals of said second semiconductor chip are arranged in a second pitch narrower than said first pitch, and wherein said first pitch is a pitch of adjacent bonding pads and adjacent first terminals, and said second pitch is a pitch of adjacent second terminals.

2. A method of manufacturing a semiconductor device according to claim 1, wherein the plural bump electrodes are solder bumps formed in an array form on the main surface of the first semiconductor chip.

3. A method of manufacturing a semiconductor device according to claim 1, further comprising the step of forming further plural bump electrodes on a rear surface, opposite the main surface, of the wiring substrate, wherein the further plural bump electrodes are electrically connected to the bonding pads of the wiring substrate.

4. A method of manufacturing a semiconductor device according to claim 1, wherein the wiring substrate is a mother board for mounting a package substrate.

5. A method of manufacturing a semiconductor device according to claim 1, wherein the first semiconductor chip includes a surface passivation film formed on the main surface thereof, an organic film formed on the passivation film and Cu wirings formed on the organic film, wherein Cu wirings are formed by an electrical plating method.

6. A method of manufacturing a semiconductor device according to claim 5, wherein the first terminals of the first semiconductor chip correspond to first ends of the Cu wirings, and wherein the plural bump electrodes are disposed on the first ends of the Cu wirings.

* * * * *